United States Patent
Obana et al.

(10) Patent No.: US 10,444,303 B2
(45) Date of Patent: Oct. 15, 2019

(54) MAGNETIC SENSOR

(71) Applicant: Alps Alpine Co., Ltd., Tokyo (JP)

(72) Inventors: Masayuki Obana, Niigata-ken (JP);
Hideto Ando, Niigata-ken (JP); Yuki Imai, Niigata-ken (JP); Kunio Yamanaka, Niigata-ken (JP); Kyoko Hotta, Niigata-ken (JP); Akira Miyatake, Niigata-ken (JP); Toshihiro Kobayashi, Niigata-ken (JP); Kenichiro Ikeda, Niigata-ken (JP); Takafumi Noguchi, Niigata-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 370 days.

(21) Appl. No.: 15/433,849

(22) Filed: Feb. 15, 2017

(65) Prior Publication Data
US 2017/0276739 A1   Sep. 28, 2017

(30) Foreign Application Priority Data
Mar. 23, 2016   (JP) ................. 2016-059279

(51) Int. Cl.
G01R 33/09   (2006.01)
G01C 21/08   (2006.01)
G01R 33/00   (2006.01)

(52) U.S. Cl.
CPC ........... *G01R 33/091* (2013.01); *G01C 21/08* (2013.01); *G01R 33/0011* (2013.01)

(58) Field of Classification Search
CPC ...... G01R 33/02; G01R 33/09; G01R 33/091; G01R 33/095; G01R 33/096;
(Continued)

(56) References Cited

U.S. PATENT DOCUMENTS

2005/0276997 A1* 12/2005 Hasegawa .............. B82Y 25/00
428/811.3
2012/0217961 A1*  8/2012 Ando ..................... B82Y 25/00
324/252
(Continued)

FOREIGN PATENT DOCUMENTS

CN   103261905   8/2013
CN   103376424   10/2013
(Continued)

OTHER PUBLICATIONS

European Search Report from European Application No. 17160333 dated Aug. 3, 2017.
(Continued)

*Primary Examiner* — Son T Le
(74) *Attorney, Agent, or Firm* — Beyer Law Group LLP

(57) ABSTRACT

A magnetic sensor including a first magneto resistive effect element located on a first surface of a substrate and having a sensitivity axis in a first direction that is one of in-plane directions of the first surface, a positioning soft magnetic body including a first most proximal portion of which a relative position with respect to the magneto resistive effect element is defined, and provided in a non-contact manner with respect to the first magneto resistive effect element, and a first soft magnetic body and a second soft magnetic body juxtaposed in the first direction and extending in a direction away from the first surface, and each of the first soft magnetic body and the second soft magnetic body is magnetically connected to the positioning soft magnetic body.

12 Claims, 23 Drawing Sheets

(58) Field of Classification Search
CPC .... G01R 33/098; G01R 33/06; G01R 33/063;
G01R 33/066; G01R 33/18; G01R
33/0327; G01R 33/0011; G01C 21/08
See application file for complete search history.

(56) References Cited

U.S. PATENT DOCUMENTS

| | | |
|---|---|---|
| 2013/0278246 A1 | 10/2013 | Stegerer et al. |
| 2013/0299930 A1 | 11/2013 | Paci et al. |
| 2014/0035573 A1* | 2/2014 | Deak .................. G01R 33/098 |
| | | 324/252 |
| 2014/0103915 A1 | 4/2014 | Satz |
| 2015/0028863 A1 | 1/2015 | Zeyen |
| 2015/0192432 A1 | 7/2015 | Noguchi et al. |
| 2015/0362564 A1 | 12/2015 | Wan et al. |

FOREIGN PATENT DOCUMENTS

| | | |
|---|---|---|
| CN | 103885005 | 6/2014 |
| JP | 2015-203647 | 11/2015 |
| WO | 2011/068146 | 6/2011 |

OTHER PUBLICATIONS

Chinese Office Action from Chinese Application No. 201410139926.2 dated Mar. 5, 2019.

* cited by examiner

MAGNETIC SENSOR

CLAIM OF PRIORITY

This application claims benefit of Japanese Patent Application No. 2016-059279 field on Mar. 23, 2016, which is hereby incorporated by reference.

BACKGROUND OF THE INVENTION

1. Field of the Invention

The present invention relates to a magnetic sensor, and more particularly, to a magnetic sensor having a soft magnetic body that converts a magnetic field component in a vertical direction into a magnetic field component in a horizontal direction.

2. Description of the Related Art

A magnetic sensor using a magneto resistive effect element can be used as a geomagnetic sensor that is incorporated in, for example, a mobile device such as a mobile phone or a smartphone and detects geomagnetism. The geomagnetic sensor is configured so as to be able to detect each of magnetic field components in an X-axis direction and a Y-axis direction orthogonal to each other in a horizontal plane and a vertical direction (Z-axis direction) orthogonal to the horizontal plane.

International Publication No. WO2011/068146 describes a magnetic sensor capable of detecting a magnetic field component in a vertical direction. However, in the magnetic sensor described in International Publication No. WO2011/068146, it is necessary for an aspect ratio (height dimension/width dimension) of a soft magnetic body that converts a magnetic field in a vertical direction into a magnetic field in a horizontal direction to be increased from 1.5 times to approximately 4 times. Therefore, a case where a strong magnetic field is applied from the outside, a magnetization direction of the soft magnetic body is directed in a height direction and residual magnetization occurs in the height direction of the soft magnetic body. Accordingly, a problem is caused in that a hysteresis of a BH curve in the height direction of the soft magnetic body increases, and sensor sensitivity is degraded due to occurrence of an offset of the magnetic sensor, or the like.

As a magnetic sensor capable of solving such a problem, Japanese Unexamined Patent Application Publication No. 2015-203647 describes a magnetic sensor including a magneto resistive effect element formed on a substrate, and a pair of soft magnetic bodies extending in a direction away from a surface of the substrate on which the magneto resistive effect element is formed, wherein when orthogonal directions in an plane of the substrate are a first direction and a second direction, the magneto resistive effect element includes a fixed magnetic layer of which a magnetization direction is fixed and a free magnetic layer of which a magnetization direction is changed by an external magnetic field, the magnetization direction of the fixed magnetic layer is directed in the first direction, the magneto resistive effect element is provided at a position where a center position in the first direction of the pair of soft magnetic bodies and a center position in the first direction of the magneto resistive effect element do not overlap, on lower surface sides of the pair of soft magnetic bodies, and the pair of soft magnetic bodies are spaced apart from each other in the first direction and face, and are connected to each other on the lower surface sides of the pair of soft magnetic bodies.

According to the magnetic sensor described in Japanese Unexamined Patent Application Publication No. 2015-203647, a pair of soft magnetic bodies are provided, and a magnetic path is formed from an upper surface side of one of the soft magnetic body to an upper surface side of the other soft magnetic body via a lower surface side of the one soft magnetic body. Therefore, even in a case where a strong external magnetic field is applied, it is difficult for a magnetization direction of the pair of soft magnetic bodies to be directed in a height direction and it is difficult for residual magnetization to occur in the height direction of the pair of soft magnetic bodies. Thus, it is possible to suppress an increase in hysteresis of the pair of soft magnetic bodies. Therefore, it is possible to convert a magnetic field component in a vertical direction into a magnetic field component in an in-plane direction of the substrate using the pair of soft magnetic bodies, and to suppress a degradation of sensitivity due to occurrence of an offset of the magnetic sensor, or the like, and obtain good sensor sensitivity.

In the magnetic sensor described in Japanese Unexamined Patent Application Publication No. 2015-203647, since residual magnetization hardly occurs in the height direction of a pair of soft magnetic bodies as described above, it is possible to have good sensor sensitivity. However, in the magnetic sensor described in Japanese Unexamined Patent Application Publication No. 2015-203647, an influence of a change in a relative position between the pair of soft magnetic bodies and the magneto resistive effect element on intensity of a magnetic field applied to the magneto resistive effect element is great, as described below. Therefore, in the magnetic sensor described in Japanese Unexamined Patent Application Publication No. 2015-203647, it is clear that sufficiently high shape accuracy or arrangement accuracy of each component is required in order to appropriately exhibit original functions of the magnetic sensor.

SUMMARY OF THE INVENTION

The present invention provides a magnetic sensor of which structural improvement has been performed so that it is easy for a magnetic sensor having good sensor sensitivity described in Japanese Unexamined Patent Application Publication No. 2015-203647 to appropriately exhibit original functions thereof.

The present invention provides a magnetic sensor, including: a magneto resistive effect element located on a first surface that is one surface of a substrate and having a sensitivity axis in a first direction that is one of in-plane directions of the first surface; a positioning soft magnetic body including a most proximal portion of which a relative position with respect to the magneto resistive effect element is defined, and provided in a non-contact manner with respect to the magneto resistive effect element; and a pair of soft magnetic bodies juxtaposed in the first direction and extending in a direction away from the first surface, wherein the pair of soft magnetic bodies are magnetically connected to the positioning soft magnetic body.

A magnetic field in a normal direction of the first surface is magnetically collected to flow through a pair of soft magnetic bodies, a flow direction thereof is changed, and a resultant magnetic field is applied as a magnetic field in an in-plane direction of the first surface from the positioning soft magnetic body to the magneto resistive effect element. In the magnetic sensor having the above configuration, intensity of the magnetic field applied to the magneto resistive effect element is hardly influenced by a change in the relative position between the pair of soft magnetic bodies and the magneto resistive effect element, as compared with the magnetic sensor having the structure described in Japanese Unexamined Patent Application Publication No. 2015-203647. Therefore, the magnetic sensor having the above configuration is excellent in ease of fabrication of a pair of soft magnetic bodies. Therefore, the magnetic sensor having the above-described configuration has good sensor sensitivity corresponding to a low profile and high quality stability.

The most proximal portion of the positioning soft magnetic body may be formed by a straight surface erected in a normal direction of the first surface. With such a configuration, it is easy to define the relative position between the most proximal portion of the positioning soft magnetic body and the magneto resistive effect element in some cases.

The two soft magnetic bodies constituting the pair of soft magnetic bodies may be formed integrally via a connection portion, and a width of the positioning soft magnetic body may be greater than a width extending in the first direction of the connection portion. With such a configuration, it is easy to widen an allowable range of the relative position between the pair of soft magnetic bodies and the positioning soft magnetic body, and it is easy to obtain a magnetic sensor with excellent ease of fabrication.

In a projection plane onto the first surface, the most proximal portion of the positioning magnetic body may be formed to overlap the magneto resistive effect element. By having such a configuration, it is possible to strengthen the magnetic field that is applied to the magneto resistive effect element in some cases.

A length of the positioning soft magnetic body in a normal direction of the first surface, that is, a thickness of the positioning soft magnetic body may be 5 μm or less. By the positioning soft magnetic body having a relatively thin shape as described above, it is easy to suppress a variation in the relative position between the positioning soft magnetic body and the most proximal position to be 50 nm or less.

The two soft magnetic bodies constituting the pair of soft magnetic bodies may be inclined in opposite directions in the first direction with respect to the first surface, and a distance between two soft magnetic bodies constituting the pair of soft magnetic bodies may increase as the soft magnetic bodies are spaced apart from the first surface. By having such a configuration, it is easy to achieve both a low profile of the magnetic sensor and improvement in sensor sensitivity in some cases.

An insulating nonmagnetic body may be located between the pair of soft magnetic bodies and the first surface and, in this case, the pair of soft magnetic bodies may include a sediment of a soft magnetic material located on a surface of the nonmagnetic body. In this disclosure, "located on the surface" includes not only a case where the soft magnetic material is located in direct contact with a member constituting the surface, but also a case where the soft magnetic material is located with a sandwiched member (for example, a protective layer or a layer formed through a conductorization process) sandwiched between the soft magnetic material and the surface. By including the above-described configuration, ease of fabrication and shape accuracy of the magnetic sensor may be improved in some cases.

The most proximal portion of the positioning soft magnetic body may be covered with the nonmagnetic body. By including such a configuration, it is easy to define the relative position between the most proximal portion and the magneto resistive effect element in some cases.

Each of the two soft magnetic bodies constituting the pair of soft magnetic bodies may further include an extension portion extending in the first direction from each of the two soft magnetic bodies constituting the pair of soft magnetic bodies, on the side opposite to the side magnetically connected to the positioning soft magnetic body. In some cases, it is possible to strengthen the magnetic field that is applied to the magneto resistive effect element by performing magnetic collection in the extension portion.

The magneto resistive effect element may include a first magneto resistive effect element proximal to the first soft magnetic body, and a second magneto resistive effect element proximal to the second soft magnetic body, the magneto resistive effect element may include a fixed magnetic layer of which magnetization is fixed in a direction along one side in the first direction, and a free magnetic layer of which a magnetization direction is changed by an external magnetic field, and the magnetization direction of the fixed magnetic layer of the first magneto resistive effect element and the magnetization direction of the fixed magnetic layer of the second magneto resistive effect element may be aligned. In this case, the first magneto resistive effect element and the second magneto resistive effect element may be connected in series to constitute a half bridge circuit.

Further, the magnetic sensor may include two half bridge circuits, and the two half bridge circuits may constitute a full bridge circuit. The two first magneto resistive effect elements and the two second magneto resistive effect elements included in the full bridge circuit may be juxtaposed in the first direction. Here, in a case where the magnetization directions of the fixed magnetic layers of all the magneto resistive effect elements included in the full bridge circuit are aligned, ease of fabrication of the magnetic sensor is enhanced.

According to the present invention, the magnetic sensor having good sensor sensitivity is provided with such a structure that it is easy to appropriately exhibit functions thereof, similar to the magnetic sensor described in Japanese Unexamined Patent Application Publication No. 2015-203647.

DESCRIPTION OF THE PREFERRED EMBODIMENTS

Hereinafter, the present invention will be described through embodiments of the present invention, but the following embodiments do not limit the inventions according to the claims. Further, not all combinations of characteristics described in the embodiments are necessarily essential to solving means of the invention. Dimensions of drawings referred to for description of the present invention are appropriately changed and shown.

Figure 1:
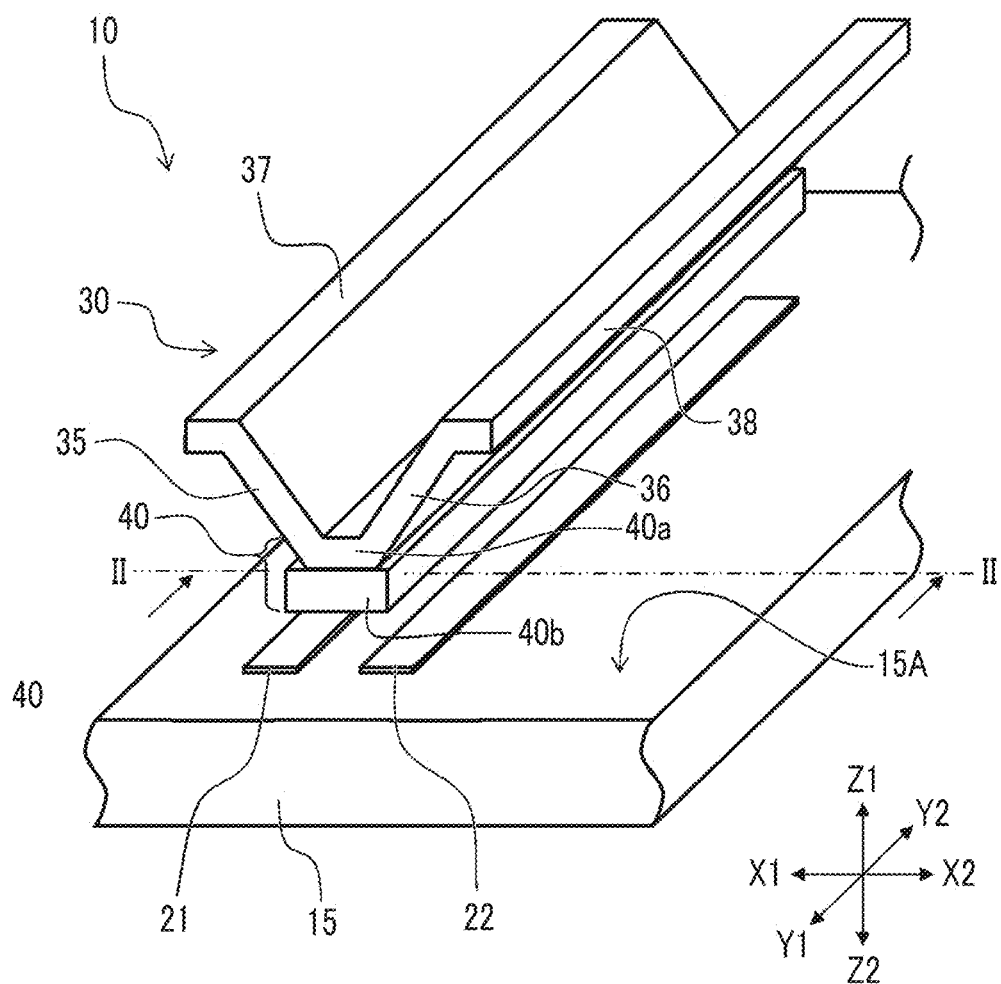
FIG. 1 is a perspective view of a magnetic sensor according to a first embodiment.
Figure 2:
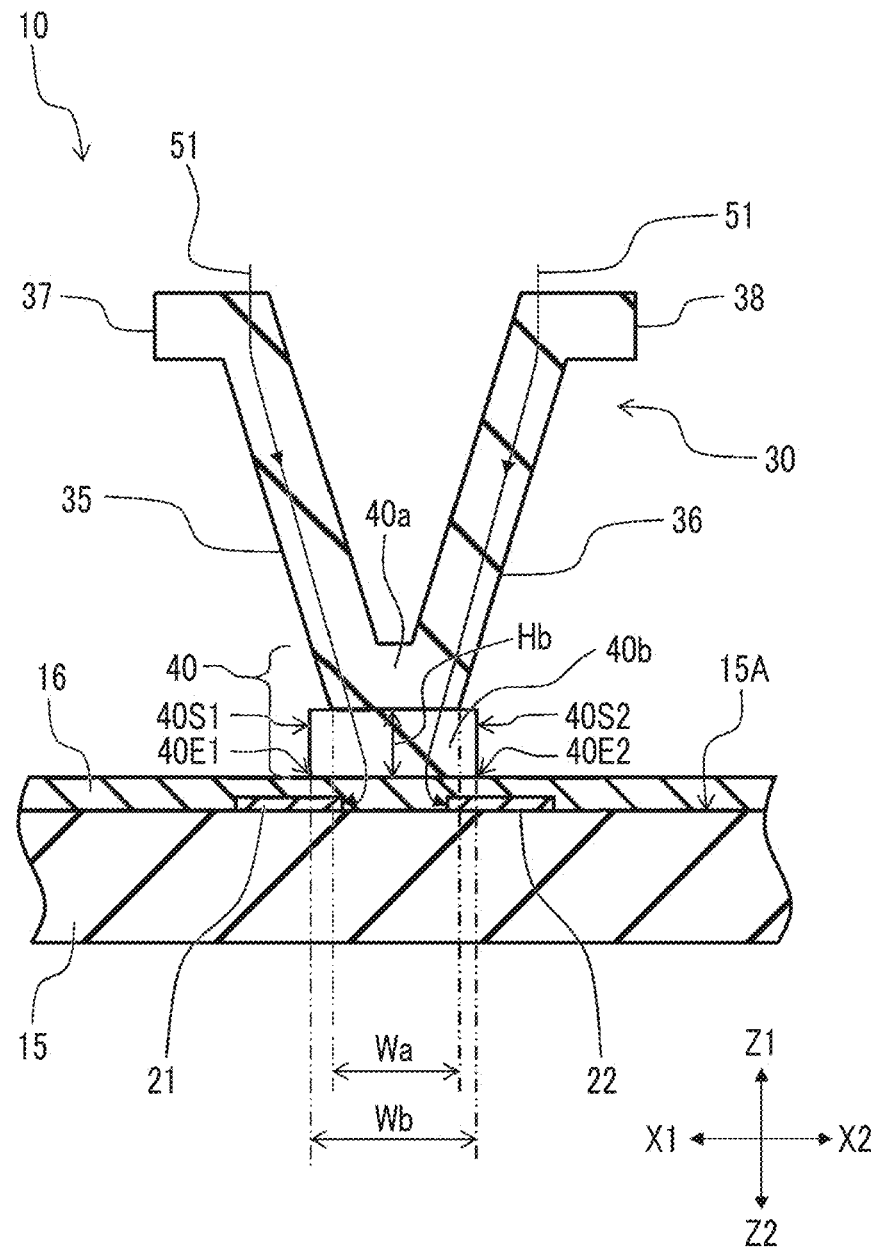
FIG. 2 is a cross-sectional view of the magnetic sensor taken along line II-II of FIG. 1 and viewed from an arrow direction.
Figure 3:
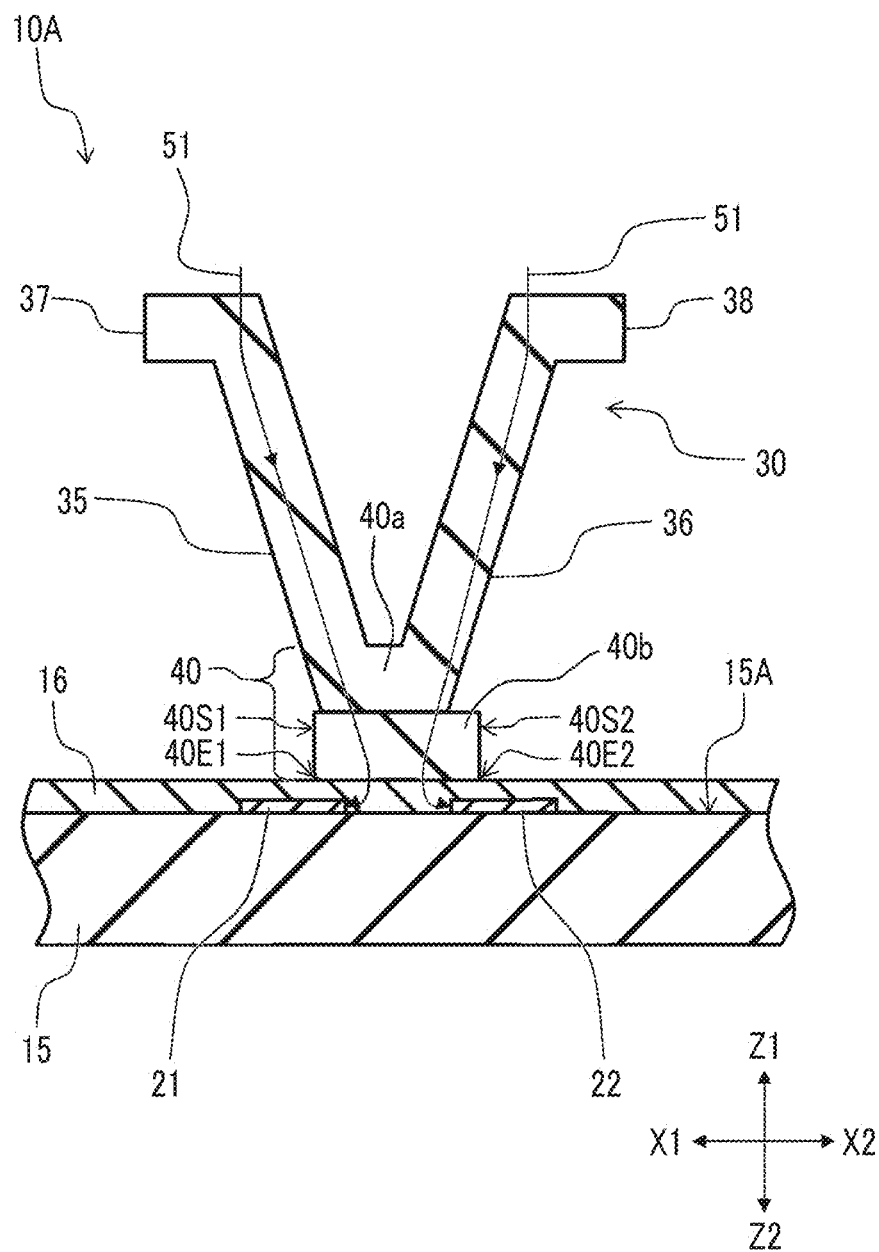
FIG. 3 is a cross-sectional view of an example of the magnetic sensor according to the first embodiment.

FIG. 1 is a perspective view of a magnetic sensor according to a first embodiment. FIG. 2 is a cross-sectional view of the magnetic sensor taken along line II-II of FIG. 1 and viewed from an arrow direction. FIG. 3 is a cross-sectional view of a magnetic sensor according to a modification example of the first embodiment.

A magnetic sensor 10 of this embodiment can be used, for example, as a Z-axis magnetic sensor that detects a magnetic field component in a vertical direction and is configured as a geomagnetic sensor mounted in a mobile device such as a mobile phone or a smartphone.

As illustrated in FIG. 1, the magnetic sensor 10 of this embodiment includes a first magneto resistive effect element 21 and a second magneto resistive effect element 22 formed on a first surface 15A which is one surface of a substrate 15, and a magnetic field direction conversion portion 30. As illustrated in FIGS. 1 and 2, the magnetic field direction conversion portion 30 has a pair of soft magnetic bodies (a first soft magnetic body 35 and a second soft magnetic body 36) and a bottom soft magnetic body 40. The first soft magnetic body 35 and the second soft magnetic body 36 are both provided to extend away from the first surface 15A. Further, when orthogonal directions in a plane of the first surface 15A are an X1-X2 direction (first direction) and an Y1-Y2 direction (second direction), the first soft magnetic body 35 and the second soft magnetic body 36 are formed to extend in the Y1-Y2 direction (second direction).

The first soft magnetic body 35 is inclined toward an X1 side in the X1-X2 direction (first direction) with respect to the first surface 15A of the substrate 15, and the second soft magnetic body 36 is inclined toward an X2 side in the X1-X2 direction (first direction) which is a direction opposite to the first soft magnetic body 35 with respect to the first surface 15A of the substrate 15. Therefore, portions of the first soft magnetic body 35 and the second soft magnetic body 36 are formed in a V shape so that a distance between the first soft magnetic body 35 and the second soft magnetic body 36 increases as the first soft magnetic body 35 and the second soft magnetic body 36 are spaced apart from the first surface 15A. A tilt angle of the first soft magnetic body 35 with respect to the first surface 15A and a tilt angle of the second soft magnetic body 36 with respect to the first surface 15A are arbitrary. The tilt angle is preferably 45° or more, and more preferably, 50° or more. The tilt angle may be substantially 90°. In this case, a sectional shape of the magnetic field direction conversion portion 30 is a U shape.

The bottom soft magnetic body 40 included in the magnetic field direction conversion portion 30 includes a connection portion 40a that integrally connects the first soft magnetic body 35 and the second soft magnetic body 36, and a positioning soft magnetic body 40b that is located between the first soft magnetic body 35 and the second soft magnetic body 36, and the first surface 15A and is magnetically connected to the first soft magnetic body 35 and the second soft magnetic body 36. In this disclosure, "magnetically connected" refers to a state in which a plurality of members having the same magnetic permeability are arranged substantially without a gap and a magnetic field leaking out of the members can be substantially ignored. As long as this state can be realized, another member may be interposed between two magnetically connected members.

The positioning soft magnetic body 40b of the magnetic sensor 10 of this embodiment is provided in a non-contact manner with respect to the first magneto resistive effect element 21. Specifically, as illustrated in FIG. 2, an insulating nonmagnetic layer 16 is interposed between the positioning soft magnetic body 40b and the first magneto resistive effect element 21. A relative position between a most proximal portion (first most proximal portion) 40E1 of the positioning soft magnetic body 40b with respect to the first magneto resistive effect element 21 and the first magneto resistive effect element 21 is defined. As a preferable example of this relative position, the first most proximal portion 40E1 is formed to overlap the first magneto resistive effect element 21 in a projection surface on the first surface 15A. The first most proximal portion 40E1 is formed by one straight surface 40S1 (a surface on the X1 side in the X1-X2 direction in FIG. 2) of the positioning soft magnetic body 40b erected in the normal direction of the first surface 15A.

The positioning soft magnetic body 40b is provided in a non-contact manner with respect to the second magneto resistive effect element 22. Specifically, an insulating nonmagnetic layer 16 is interposed between the positioning soft magnetic body 40b and the second magneto resistive effect element 22. A relative position between a most proximal portion (second most proximal portion) 40E2 of the positioning soft magnetic body 40b with respect to the second magneto resistive effect element 22 and the second magneto resistive effect element 22 is defined. Specifically, the second most proximal portion 40E2 of the positioning soft magnetic body 40*b* is formed to overlap the second magneto resistive effect element 22 in the projection surface on the first surface 15A. The second most proximal portion 40E2 is formed by the other straight surface (a surface on the X2 side in the X1-X2 direction in FIG. 2) 40S2 of the positioning soft magnetic body 40*b* erected in the normal direction of the first surface 15A. In the magnetic sensor 10 of this embodiment, the surface 40S1 and the surface 40S2 are two facing surfaces of the positioning soft magnetic body 40*b*.

As described above, the first soft magnetic body 35 and the second soft magnetic body 36 included in the magnetic field direction conversion portion 30 are integrally formed through the connection portion 40*a*. A width Wb extending in the first direction (the X1-X2 direction) of the positioning soft magnetic body 40*b* is larger than a width Wa extending in the first direction (the X1-X2 direction) of the connection portion 40*a*. It is possible to improve ease of fabrication due to the magnetic sensor 10 having such a configuration. This point will be described below with reference to FIG. 3.

A first extension portion 37 and a second extension portion 38 respectively extending in the first direction (the X1-X2 direction) from the first soft magnetic body 35 and the second soft magnetic body 36 are further included on the side (Z2 side in Z1-Z2 direction) of the first soft magnetic body 35 and the second soft magnetic body 36 opposite to the first surface 15A. Specifically, the first extension portion 37 extends to the X1 side in the X1-X2 direction (first direction) continuously from the first soft magnetic body 35, and the second extension portion 38 extends to the X2 side in the X1-X2 direction (first direction) continuously from the second soft magnetic body 36. By providing the extension portions 37 and 38 in this manner, plane areas of the first soft magnetic body 35 and the second soft magnetic body 36 on the Z2 side in the Z1-Z2 direction can be increased by the first extension portion 37 and the second extension portion 38, and the magnetic field component 51 in the vertical direction (the normal direction of the first surface 15A; the Z1-Z2 direction) can be effectively magnetically collected without thickly forming the first soft magnetic body 35 and the second soft magnetic body 36.

As illustrated in FIG. 2, in a case where an external magnetic field is applied in a direction perpendicular to the first surface 15A of the substrate 15 (a normal direction of the first surface 15A; a Z1-Z2 direction), the magnetic field component 51 in the vertical direction (the normal direction of the first surface 15A; the Z1-Z2 direction) is magnetically collected in the first soft magnetic body 35 and the second soft magnetic body 36 of the magnetic field direction conversion portion 30. Magnetic field components 51 in the vertical direction (the normal direction of the first surface 15A; the Z1-Z2 direction) flowing into the first extension portion 37 and the second extension portion 38 also flow into the inside of the first soft magnetic body 35 and the second soft magnetic body 36.

For the magnetic field component 51 in the vertical direction (normal direction of the first surface 15A; the Z1-Z2 direction) flowing through the inside of the first soft magnetic body 35 and the second soft magnetic body 36 in this manner, a magnetic field flowing from the positioning soft magnetic body 40*b* of the magnetic field direction conversion portion 30 is converted into a magnetic field in the horizontal direction (in-plane direction of the substrate 15). Since the first magneto resistive effect element 21 and the second magneto resistive effect element 22 are arranged between the magnetic field direction conversion portion 30 and the first surface 15A, the magnetic field component converted in the horizontal direction is applied to each of the first magneto resistive effect element 21 and the second magneto resistive effect element 22. Here, as described above, a relative position between the first most proximal portion 40E1 of the positioning soft magnetic body 40*b* and the first magneto resistive effect element 21 is defined, and a relative position between the second most proximal portion 40E2 and the second magneto resistive effect element 22 is defined. By defining the relative positions, it is possible to stabilize application of the magnetic field flowing from the first surface 15A side of the magnetic field direction conversion portion 30 to the first magneto resistive effect element 21 and application of the magnetic field to the second magneto resistive effect element 22.

This point will be specifically described with reference to FIG. 3. FIG. 3 is an example of a cross-sectional view of the magnetic sensor according to the first embodiment. In a magnetic sensor 10A according to this example, a portion including a first soft magnetic body 35, a connection portion 40*a*, and a second soft magnetic body 36 in a magnetic field direction conversion portion 30 is shifted to an X1 side in an X1-X2 direction, unlike the above-described magnetic sensor 10. However, a relative position between a first most proximal portion 40E1 of a positioning soft magnetic body 40*b* and a first magneto resistive effect element 21, and a relative position between a second most proximal portion 40E2 of a positioning soft magnetic body 40*b* and a second magneto resistive effect element 22 are the same in the magnetic sensor 10 illustrated in FIG. 1 and the magnetic sensor 10A illustrated in FIG. 3.

As will be described below, an influence of a change in a relative position between the magneto resistive effect element (first magneto resistive effect element 21 and second magneto resistive effect element 22) arranged between the magnetic field direction conversion portion 30 and the first surface 15A and a most proximal portion (first most proximal portion 40E1 and second most proximal portion 40E2) of the positioning soft magnetic body 40*b* on a magnetic field applied to the magneto resistive effect element is more prominent than an influence of a change in a relative position between the magneto resistive effect element (first magneto resistive effect element 21 and second magneto resistive effect element 22) and the first soft magnetic body 35 and the second soft magnetic body 36 on the magnetic field applied to the magneto resistive effect element.

Figure 4:
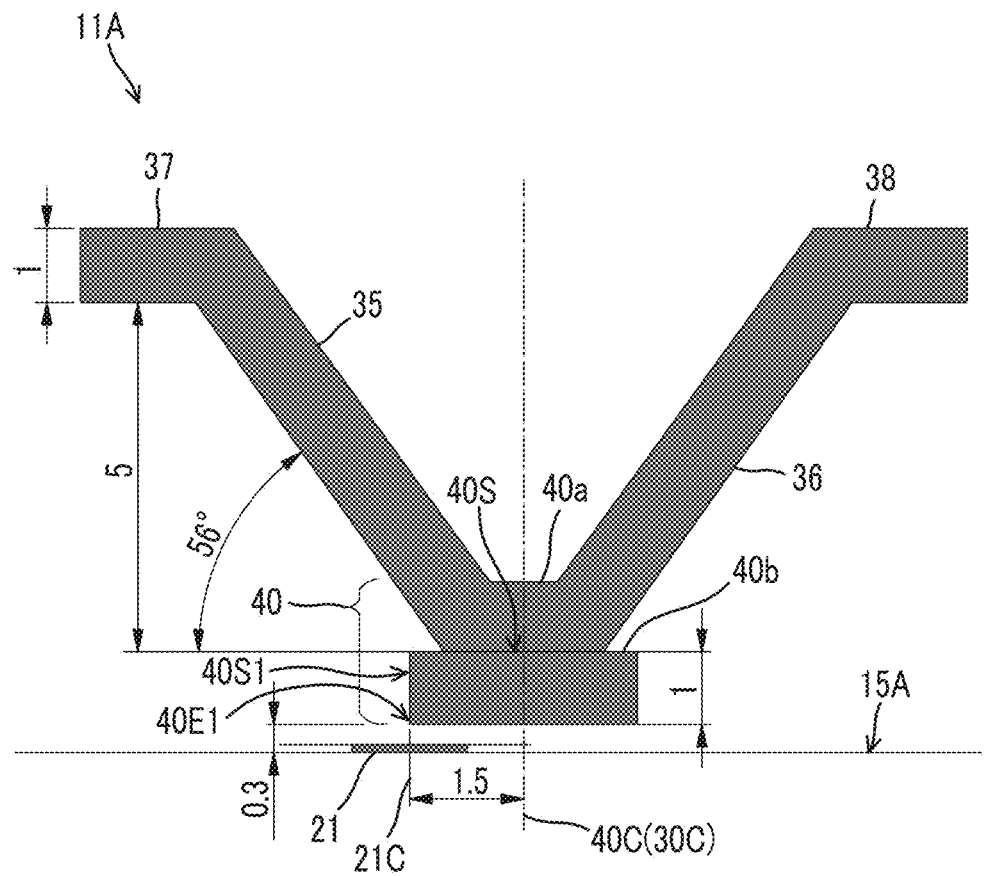
FIG. 4 is a cross-sectional view of a magnetic sensor used for simulation.
Figure 4:
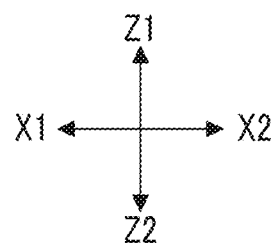

FIG. 4 is a cross-sectional view of one (standard arrangement product) of a magnetic sensor used for simulation.

A magnetic sensor 11A has the same structure as the magnetic sensor 10. That is, a first magneto resistive effect element 21 provided on a first surface 15A has a sensitivity axis in a first direction (the X1-X2 direction).

The positioning soft magnetic body 40*b* which is a portion of the bottom soft magnetic body 40 is located in a non-contact manner with respect to the first magneto resistive effect element 21 on an upward side (on the Z1 side in a Z1-Z2 direction) of the first magneto resistive effect element 21. For the first most proximal portion 40E1 located at a most proximal position in the first direction (the X1-X2 direction) with respect to the first magneto resistive effect element 21 in the positioning soft magnetic body 40*b*, a relative position with respect to the first magneto resistive effect element 21 is defined. Specifically, in a projection onto the first surface 15A, the first most proximal portion 40E1 is formed so as to overlap the first magneto resistive effect element 21. More specifically, the first most proximal portion 40E1 is formed by a straight surface 40S1 erected in a normal direction of the first surface 15A, and a position in the first direction (the X1-X2 direction) of the surface 40S1 is set to overlap a center position 21C in the first direction (the X1-X2 direction) of the first magneto resistive effect element 21.

A pair of soft magnetic bodies (first soft magnetic body 35 and second soft magnetic body 36) extends in a direction away from the first surface 15A, and is juxtaposed in a first direction (the X1-X2 direction) which is one of in-plane directions of the first surface 15A. The pair of soft magnetic bodies (the first soft magnetic body 35 and the second soft magnetic body 36) are formed integrally through a connection portion 40a that is a portion of the bottom soft magnetic body 40 and is magnetically connected to the positioning soft magnetic body 40b.

A first extension portion 37 extends toward an X1 side in a first direction (the X1-X2 direction) from the first soft magnetic body 35 on the side opposite to the side of the first soft magnetic body 35 that is magnetically connected to the positioning soft magnetic body 40b. A second extension portion 38 extends toward an X2 side in the first direction (the X1-X2 direction) from the second soft magnetic body 36 on the side opposite to the side of the second soft magnetic body 36 that is magnetically connected to the positioning soft magnetic body 40b.

In the magnetic sensor 11A, a center position 40C in the first direction (the X1-X2 direction) of the positioning soft magnetic body 40b and a center position 30C in the first direction (the X1-X2 direction) of the pair of soft magnetic bodies (the first soft magnetic body 35 and the second soft magnetic body 36) are set to overlap each other.

Dimensions of the respective portions and the like are illustrated in FIG. 4. A unit of a value indicating the dimension is μm. A thickness (a length in the Z1-Z2 direction) of the positioning soft magnetic body 40b is 1 μm. A distance in the Z1-Z2 direction between the first most proximal portion 40E1 of the positioning soft magnetic body 40b and the first surface 15A is 0.3 μm. A distance in the first direction (the X1-X2 direction) between the first most proximal portion 40E1 of the positioning soft magnetic body 40b and a center position 40C in the first direction (the X1-X2 direction) of the positioning soft magnetic body 40b is 1.5 μm. A tilt angle (which is assumed as an angle defined in a range of 0 to 90°. The same applies below) of the pair of soft magnetic bodies (the first soft magnetic body 35 and the second soft magnetic body 36) with respect to a surface (second surface) 40S opposite to the side of the positioning soft magnetic body 40b facing the first surface 15A is 56°. A distance in the Z1-Z2 direction between a surface of the extension portion (the first extension portion 37 and the second extension portion 38) facing the first surface 15A and the second surface 40S has 5 μm. A thickness from surfaces of the pair of soft magnetic bodies (the first soft magnetic body 35 and the second soft magnetic body 36), the connection portion 40a, and the extension portion (the first extension portion 37 and the second extension portion 38) on the side facing the first surface 15A to a surface on the opposite side is 1 μm.

Figure 5:
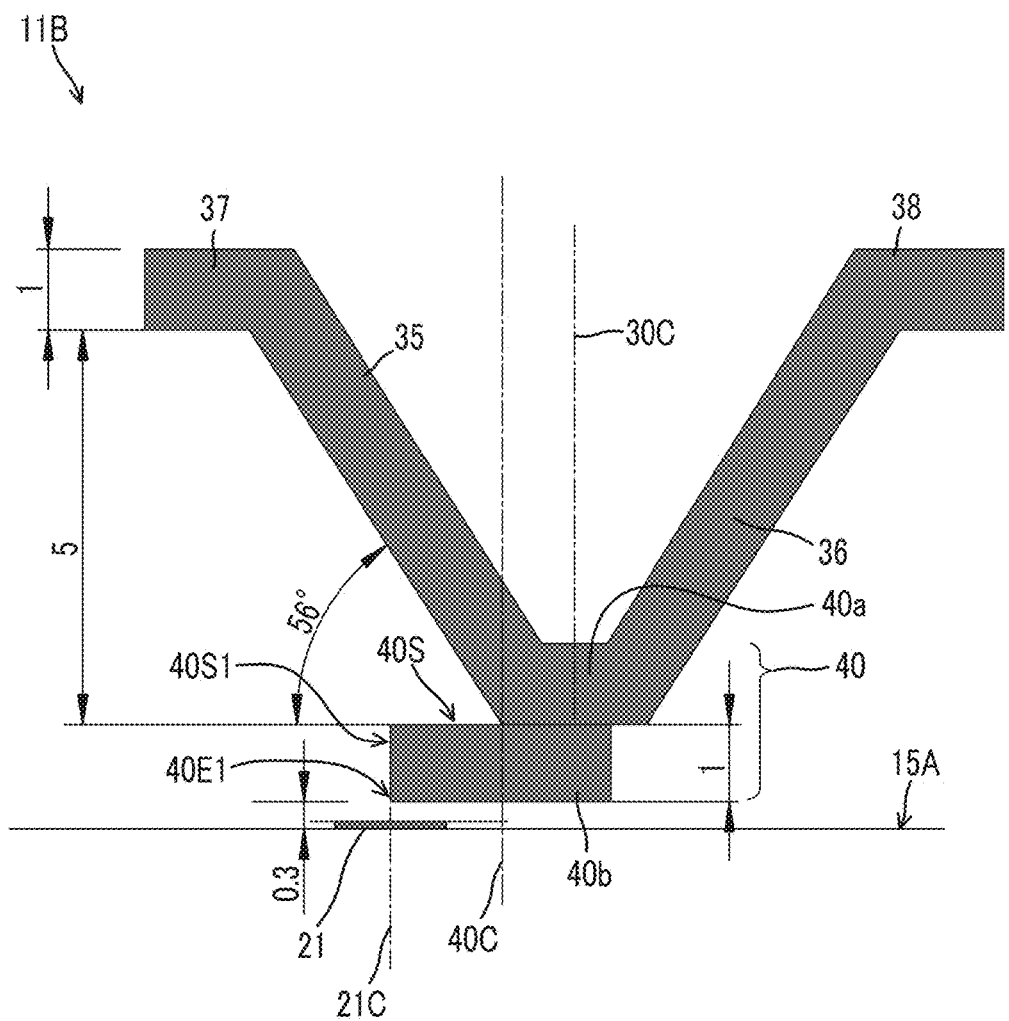
FIG. 5 is a cross-sectional view of a magnetic sensor used for simulation.
Figure 5:
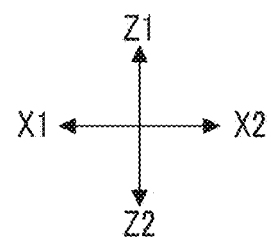

FIG. 5 is a cross-sectional view of one magnetic sensor (first offset product) used for simulation. In a magnetic sensor 11B illustrated in FIG. 5, a relative position between the first most proximal portion 40E1 of the positioning soft magnetic body 40b and the first magneto resistive effect element 21 is the same as that in the magnetic sensor 11A illustrated in FIG. 4. However, a relative position in the first direction (the X1-X2 direction) between the positioning soft magnetic body 40b and the pair of soft magnetic bodies (the first soft magnetic body 35 and the second soft magnetic body 36) is different. Specifically, the center position 30C in the first direction (the X1-X2 direction) of the pair of soft magnetic bodies (the first soft magnetic body 35 and the second soft magnetic body 36) is shifted by 1 μm toward the X2 side in the first direction (the X1-X2 direction) relative to a center position 40C in the first direction (the X1-X2 direction) of the positioning soft magnetic body 40b.

Figure 6:
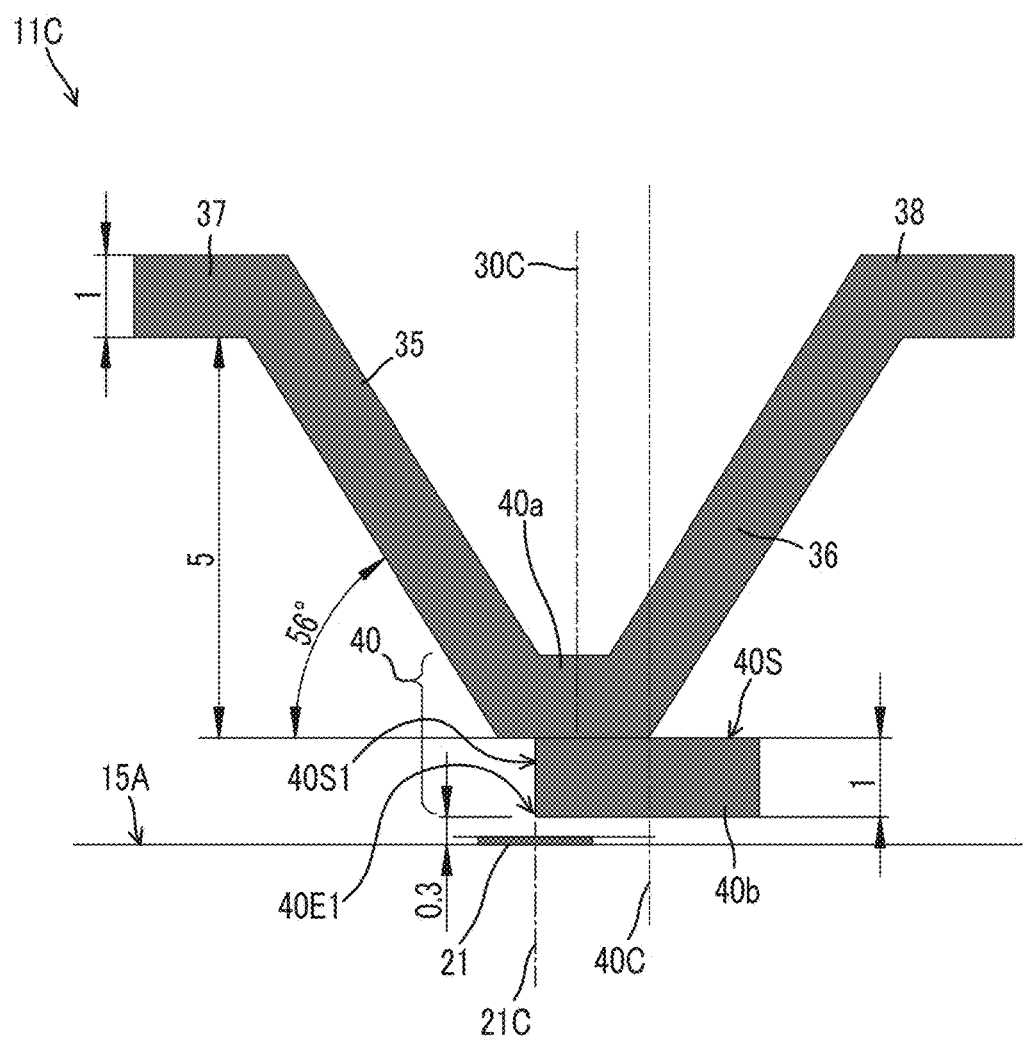
FIG. 6 is a cross-sectional view of a magnetic sensor used for simulation.
Figure 6:
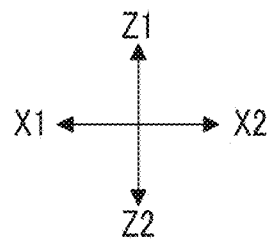

FIG. 6 is a cross-sectional view of one magnetic sensor (second offset product) used for simulation. In a magnetic sensor 11C illustrated in FIG. 6, a relative position between the first most proximal portion 40E1 of the positioning soft magnetic body 40b and the first magneto resistive effect element 21 is the same as that in the magnetic sensor 11A illustrated in FIG. 4. However, a relative position in the first direction (the X1-X2 direction) between the positioning soft magnetic body 40b and the pair of soft magnetic bodies (the first soft magnetic body 35 and the second soft magnetic body 36) is different. Specifically, the center position 30C in the first direction (the X1-X2 direction) of the pair of soft magnetic bodies (the first soft magnetic body 35 and second soft magnetic body 36) is shifted by 1 μm toward the X1 side in the first direction (the X1-X2 direction) relative to a center position 40C in the first direction (the X1-X2 direction) of the positioning soft magnetic body 40b.

Figure 7:
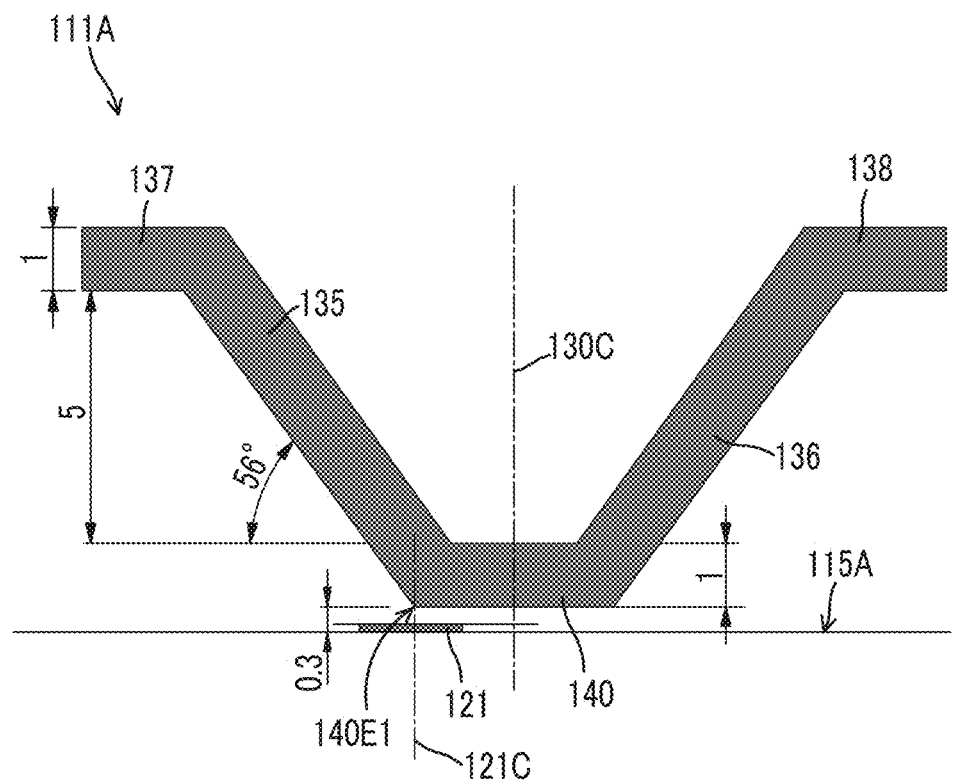
FIG. 7 is a cross-sectional view of a comparative magnetic sensor used for simulation.
Figure 7:
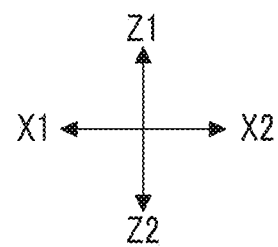

FIG. 7 is a cross-sectional view of one comparative magnetic sensor (standard arrangement product) used for simulation. A comparative magnetic sensor 111A illustrated in FIG. 7 has the structure described in Japanese Unexamined Patent Application Publication No. 2015-203647. That is, a magneto resistive effect element 121 is formed on a reference surface 115A. A pair of soft magnetic bodies 135 and 136 extend in a direction away from the reference surface 115A. The magneto resistive effect element 121 includes a fixed magnetic layer of which a magnetization direction is fixed, and a free magnetic layer of which a magnetization direction is changed by an external magnetic field. The magnetization direction of the fixed magnetic layer is set to be in a direction X1-X2, and the magneto resistive effect element 121 is provided at a position at which a center position 130C in the X1-X2 direction of the pair of soft magnetic bodies 135 and 136 and a center position 121C in the X1-X2 direction of the magneto resistive effect element 121 do not overlap on the lower surface side (the Z2 side in the Z1-Z2 direction) of the pair of soft magnetic bodies 135 and 136. The pair of soft magnetic bodies 135 and 136 are spaced apart from each other in the X1-X2 direction and face each other, and are connected on the lower surface side (the Z2 side in the Z1-Z2 direction) of the pair of soft magnetic bodies 135 and 136. A connection portion thereof constitutes a bottom portion 140 of the magnetic field direction conversion portion 130. Extension portions 137 and 138 extending in the X1-X2 direction continuously from the pair of soft magnetic bodies 135 and 136 are provided on the upper surface side (the Z1 side in the Z1-Z2 direction) of the pair of soft magnetic bodies 135 and 136.

In the comparative magnetic sensor 111A illustrated in FIG. 7, a position in the X1-X2 direction of the most proximal portion 140E1 that is a portion most proximal to the magneto resistive effect element 121 in the bottom portion 140 is set to overlap a center position 121C in the X1-X2 direction of the magneto resistive effect element 121.

A dimension of each portion and the like are illustrated in FIG. 7. A unit of a value indicting the dimension is μm. A thickness of the bottom portion 140 (a length in a Z1-Z2 direction) is 1 μm. A distance in the Z1-Z2 direction between the most proximal portion 140E1 and the reference surface 115A is, 0.3 μm. A distance in the X1-X2 direction between the most proximal portion 140E1 and the center position 130C in the X1-X2 direction of the pair of soft magnetic bodies 135 and 136 is 1.5 µm. A tilt angle of the pair of soft magnetic bodies 135 and 136 with respect to the surface on the side opposite to the side of the bottom portion 140 facing the reference surface 115A is 56°. A distance in the Z1-Z2 direction between the surface on the side opposite to the side of the bottom portion 140 facing the reference surface 115A and the surfaces of the extension portions 137 and 138 facing the reference surface 115A is 5 µm. A thickness from a surface of the pair of soft magnetic bodies 135 and 136 and the extension portions 137 and 138 on the side facing the reference surface 115A to the surface on the opposite side is 1 µm.

Figure 8:
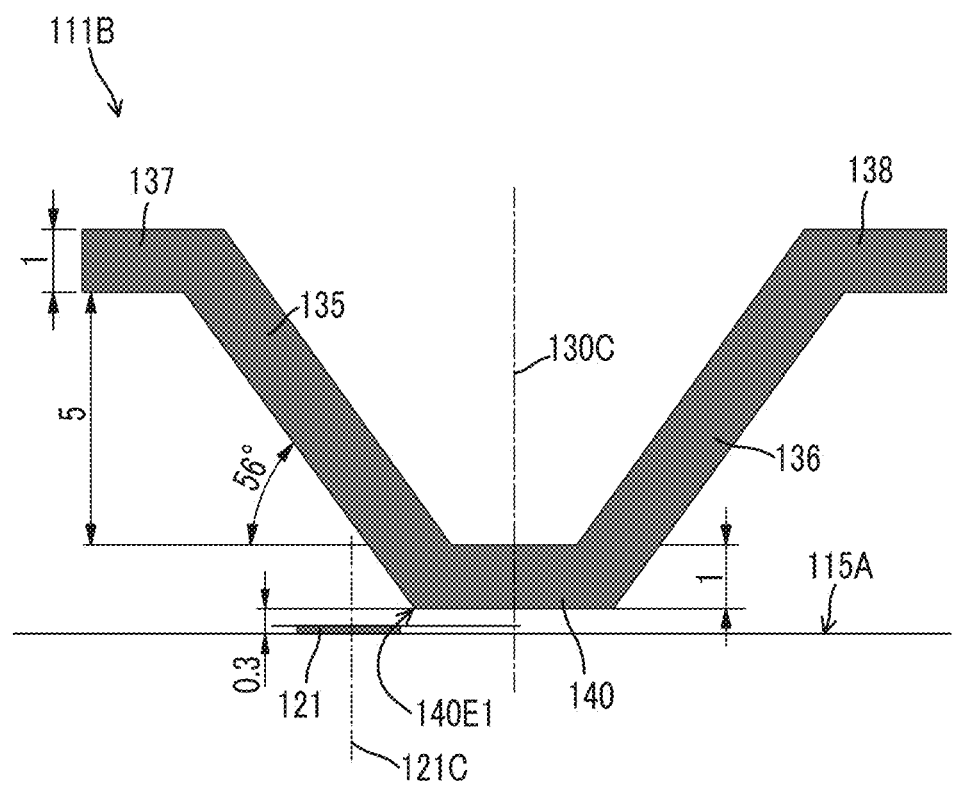
FIG. 8 is a cross-sectional view of a comparative magnetic sensor used for simulation.
Figure 8:
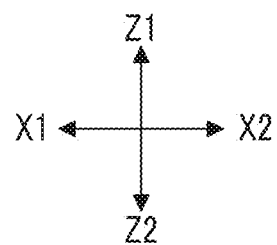

FIG. 8 is a cross-sectional view of a comparative magnetic sensor (first offset product) used for simulation. In a comparative magnetic sensor 111B illustrated in FIG. 8, a relative position in the X1-X2 direction between a most proximal portion 140E1 of a bottom portion 140 and a pair of soft magnetic bodies 135 and 136 is different from that in the comparative magnetic sensor 111A illustrated in FIG. 7. Specifically, in the comparative magnetic sensor 111A illustrated in FIG. 7, a position in the X1-X2 direction of the most proximal portion 140E1 is set to overlap the center position 121C in the X1-X2 direction of the magneto resistive effect element 121, whereas in the comparative magnetic sensor 111B illustrated in FIG. 8, a position in the X1-X2 direction of the most proximal portion 140E1 is shifted by 1 µm to the X2 side in the X1-X2 direction relative to the center position 121C in the X1-X2 direction of the magneto resistive effect element 121.

Figure 9:
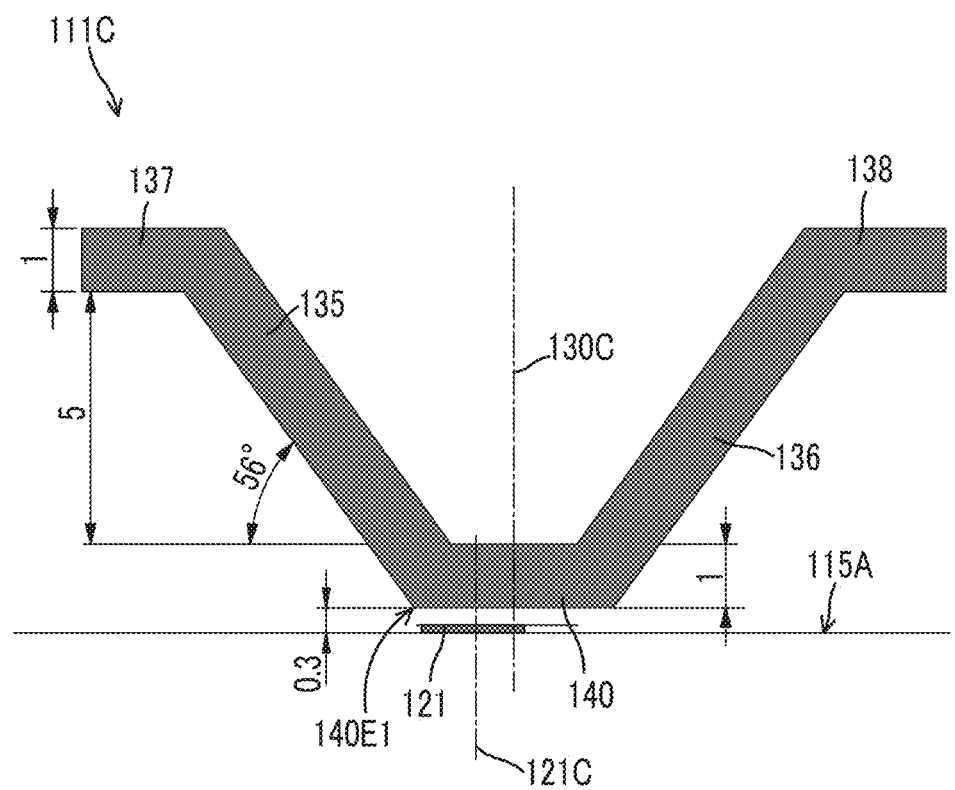
FIG. 9 is a cross-sectional view of a comparative magnetic sensor used for simulation.
Figure 9:
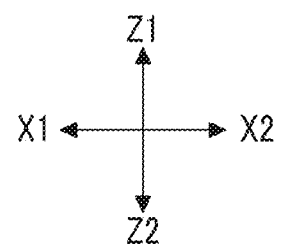

FIG. 9 is a cross-sectional view of one comparative magnetic sensor (first offset product) used for simulation. The comparative magnetic sensor 111C illustrated in FIG. 9 is different from the comparative magnetic sensor 111A illustrated in FIG. 7 in a relative position in an X1-X2 direction between the most proximal portion 140E1 of the bottom portion 140 and a pair of soft magnetic bodies 135 and 136. Specifically, in the comparative magnetic sensor 111A illustrated in FIG. 7, the position in the X1-X2 direction of the most proximal portion 140E1 is set to overlap a center position 121C in the X1-X2 direction of the magneto resistive effect element 121, whereas in the comparative magnetic sensor 111C illustrated in FIG. 9, the position in the X1-X2 direction of the most proximal portion 140E1 is shifted by 1 µm toward the X1 side in the X1-X2 direction relative to the center position 121C in the X1-X2 direction of the magneto resistive effect element 121.

A simulation of how much magnetic field is applied in the X1-X2 direction that is a sensitivity axis direction of the first magneto resistive effect element 21 and the magneto resistive effect element 121 when a magnetic field is applied in the Z1-Z2 direction to the magnetic sensors 11A, 11B, and 11C and the comparative magnetic sensors 111A, 111B, and 111C illustrated in FIGS. 4 to 9 was performed. A result thereof is shown in Table 1 and Table 2.

Table 1 shows a simulation result of a magnetic field in a sensitivity axis direction of the magnetic sensor 11A (standard product), the magnetic sensor 11B (first offset product), and the magnetic sensor 11C (second offset product). Table 2 shows a simulation result of a magnetic field in a sensitivity axis direction of the comparative magnetic sensor 111A (standard product), the comparative magnetic sensor 111B (first offset product), and the comparative magnetic sensor 111C (second offset product). An input magnetic field in Table 1 means a magnetic field applied in the Z1-Z2 direction.

TABLE 1

| Input magnetic field (mT) | Magnetic field (mT) in sensitivity axis direction | | |
|---|---|---|---|
| | Standard product | First offset product | second offset product |
| 1.2 | 1.150 | 1.171 | 1.234 |
| 2.4 | 2.300 | 2.341 | 2.468 |
| 3.6 | 3.450 | 3.512 | 3.702 |

TABLE 2

| Input magnetic field (mT) | Magnetic field (mT) in sensitivity axis direction | | |
|---|---|---|---|
| | Standard product | First offset product | second offset product |
| 1.2 | 0.755 | 0.894 | 0.093 |
| 2.4 | 1.510 | 1.788 | 0.186 |
| 3.6 | 2.264 | 2.682 | 0.278 |

As shown in Table 1 and Table 2, a difference between the magnetic sensor 11B (first offset product) and the magnetic sensor 11C (second offset product), and the magnetic sensor 11A (standard product) was smaller than a difference between the comparative magnetic sensor 111B (first offset product) and the comparative magnetic sensor 111C (second offset product), and the comparative magnetic sensor 111A (standard product). In order to confirm this point, a change rate R (unit: %) of a magnetic field T1 in a sensitivity axis direction of the offset product to a magnetic field T0 in the sensitivity axis direction of the standard product was calculated using the following equation on the basis of results in Table 1 and Table 2. A result thereof is shown in Table 3 and Table 4.

$$R=(T1-T0)/T0\times 100$$

TABLE 3

| Input magnetic field (mT) | Change rate (%) of magnetic field in sensitivity axis direction | | |
|---|---|---|---|
| | Standard product | First offset product | second offset product |
| 1.2 | 0.00 | 1.79 | 7.30 |
| 2.4 | 0.00 | 1.79 | 7.30 |
| 3.6 | 0.00 | 1.79 | 7.30 |

TABLE 4

| Input magnetic field (mT) | Change rate (%) of magnetic field in sensitivity axis direction | | |
|---|---|---|---|
| | Standard product | First offset product | second offset product |
| 1.2 | 0.00 | 18.47 | −87.70 |
| 2.4 | 0.00 | 12.31 | −87.70 |
| 3.6 | 0.00 | 18.47 | −87.70 |

It is understood from Tables 3 and 4 that an influence of a magnetic field detected in the magneto resistive effect element when a relative position between one pair of soft magnetic bodies and the magneto resistive effect element is changed in the magnetic sensor including the positioning soft magnetic body 40b as in the magnetic sensor 10 of this embodiment is much smaller than an influence of a magnetic sensor not including the positioning soft magnetic body 40b as in the magnetic sensor described in Japanese Unexamined Patent Application Publication No. 2015-203647.

Thus, if a relative position between the magneto resistive effect elements (the first magneto resistive effect element 21 and the second magneto resistive effect element 22) and the most proximal portions (the first most proximal portion 40E1 and the second most proximal portion 40E2) of the positioning soft magnetic body 40b is appropriately defined, a magnetic field in a vertical direction (a normal direction of the first surface 15A; a Z1-Z2 direction) can pass through the magnetic field direction conversion portion 30, be converted into a magnetic field in a horizontal direction (an in-plane direction of the first surface 15A), and be appropriately measured by the magneto resistive effect element (the first magneto resistive effect element 21 and the second magneto resistive effect element 22) even when the relative position between the magneto resistive effect element (the first magneto resistive effect element 21 and the second magneto resistive effect element 22), and the first soft magnetic body 35 and the second soft magnetic body 36 is changed.

In the magnetic sensor 10 or 10A according to this embodiment, the magnetic field direction conversion portion 30 includes the first soft magnetic body 35 and the second soft magnetic body 36 extending in the direction away from the first surface 15A. Thus, measurement of the magnetic field in the vertical direction (the normal direction of the first surface 15A; the Z1-Z2 direction) is realized. Each of the first soft magnetic body 35 and the second soft magnetic body 36 is magnetically connected to the bottom soft magnetic body 40. Thus, excellent sensor sensitivity is realized. Here, it is not easy to fabricate the magnetic field direction conversion portion 30 having a V-shaped sectional shape with high shape accuracy. Therefore, in the magnetic sensor 10 or 10A according to this embodiment, as described above, a portion (the positioning soft magnetic body 40b) particularly influencing sensor sensitivity is fabricated in a shape that is relatively easy to fabricate (for example, a flat plate shape along the first surface 15A) with high shape accuracy, and a portion other than the positioning soft magnetic body 40b and, particularly, the first soft magnetic body 35 and the second soft magnetic body 36 having a three-dimensional shape is configured as a member that magnetically connects to the positioning soft magnetic body 40b so that an influence of a variation in a shape of the portion or a position relative to the positioning soft magnetic body 40b on the sensor sensitivity is suppressed.

A specific shape of the positioning soft magnetic body 40b is not limited as long as the shape can be formed with high shape accuracy as described above. In a case where the positioning soft magnetic body 40b is fabricated using a normal semiconductor fabricating process, it is easy to suppress positional variations of the first most proximal portion 40E1 and the second most proximal portion 40E2 of the positioning soft magnetic body 40b to 50 nm or less, by causing a thickness Hb (a length in the normal direction (the Z1-Z2 direction) of the first surface 15A) of the positioning soft magnetic body 40b to be equal to or less than 5 μm. From the viewpoint of reducing the positional variations of the first most proximal portion 40E1 and the second most proximal portion 40E2 of the positioning soft magnetic body 40b more stably, a ratio (an aspect ratio) of a width Wb extending in the first direction (the X1-X2 direction) of the positioning soft magnetic body 40b to the thickness Hb of the positioning soft magnetic body 40b (the length in the normal direction (the Z1-Z2 direction) of the first surface) may be preferably 1 or more and, more preferably, 3 or more.

In this embodiment, the first soft magnetic body 35 and the second soft magnetic body 36 are formed of a soft magnetic material including at least one material selected from NiFe, CoFe, CoFeSiB, CoZrTi, and CoZrNb. Further, the same material as the first soft magnetic body 35 and the second soft magnetic body 36 is used for the bottom soft magnetic body 40 (the connection portion 40a and the positioning soft magnetic body 40b), the first extension portion 37, and the second extension portion 38. In the magnetic sensor 10 or 10A according to this embodiment, the connection portion 40a, the first extension portion 37, and the second extension portion 38 are formed continuously to the first soft magnetic body 35 and the second soft magnetic body 36, and the positioning soft magnetic body 40b is magnetically connected to the first soft magnetic body 35 and the second soft magnetic body 36.

Figure 10:
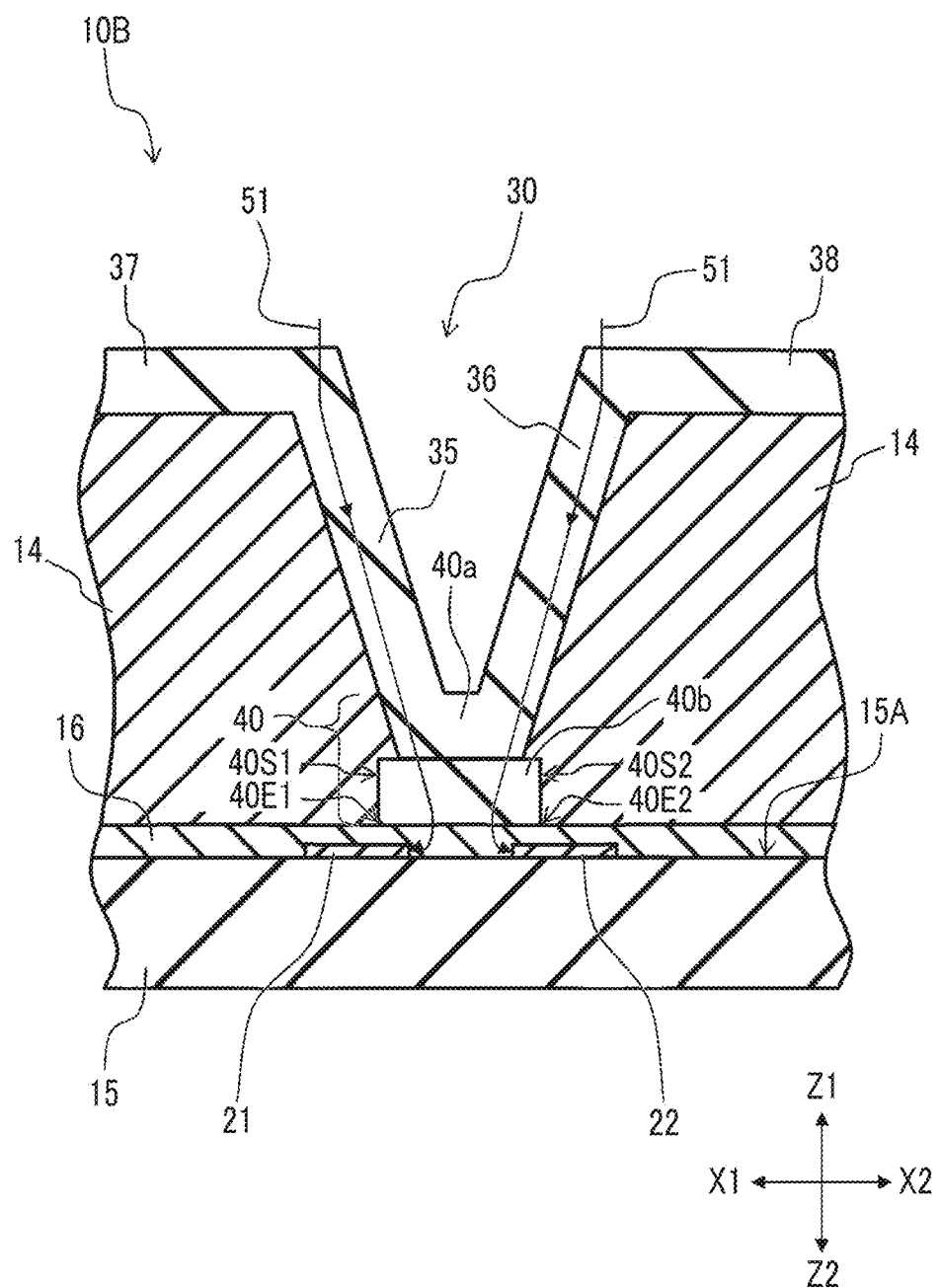
FIG. 10 is a cross-sectional view of a specific example of the magnetic sensor according to the first embodiment.

FIG. 10 is a cross-sectional view of a specific example of the magnetic sensor according to the first embodiment. In the magnetic sensor 10 or 10A according to this embodiment described above, a special member is not provided in an area around the positioning soft magnetic body 40b between the first soft magnetic body 35 and the second soft magnetic body 36, and the first surface 15A. Therefore, a surface 40S1 on which the first most proximal portion 40E1 is formed and a surface 40S2 on which the second most proximal portion 40E2 is formed are exposed, but the present invention is not limited thereto. For example, an insulating nonmagnetic body may be located in an area thereof, as illustrated in FIG. 10.

In a magnetic sensor 10B illustrated in FIG. 10, an insulating nonmagnetic body 14 is located in the area around the positioning soft magnetic body 40b between the first soft magnetic body 35 and the second soft magnetic body 36, and the first surface 15A. Specifically, the nonmagnetic body 14 is located to be brought into contact with an insulating nonmagnetic layer 16, the positioning soft magnetic body 40b, the first soft magnetic body 35, the second soft magnetic body 36, a first extension portion 37, and a second extension portion 38.

By the nonmagnetic body 14 being located in this manner, ease of fabrication of the first soft magnetic body 35 and the second soft magnetic body 36 is improved, and improving shape accuracy thereof is facilitated. Specifically, each of the first soft magnetic body 35 and the second soft magnetic body 36 may include a sediment of a soft magnetic material located on a surface opposite to the side of the nonmagnetic body 14 facing the first surface 15A. By changing a shape of the surface opposite to the side of the nonmagnetic body 14 facing the first surface 15A, the shape of the first soft magnetic body 35 and the second soft magnetic body 36 formed on the surface can be controlled. Examples of the sediment of the soft magnetic material include a sediment formed by a wet deposition technology such as plating or coating, or a sediment formed by a dry deposition technology such as PVD or CVD.

In the magnetic sensor 10B illustrated in FIG. 10, the most proximal portions (the first most proximal portion 40E1 and the second most proximal portion 40E2) of the positioning soft magnetic body 40b are covered with the nonmagnetic body 14. By the nonmagnetic body 14 being located in this manner, a relative position between the most proximal portions (the first most proximal portion 40E1 and the second most proximal portion 40E2) of the positioning soft magnetic body 40b and the magneto resistive effect elements (the first magneto resistive effect element 21 and the second magneto resistive effect element 22) may be able to be defined more stably.

Figure 11:
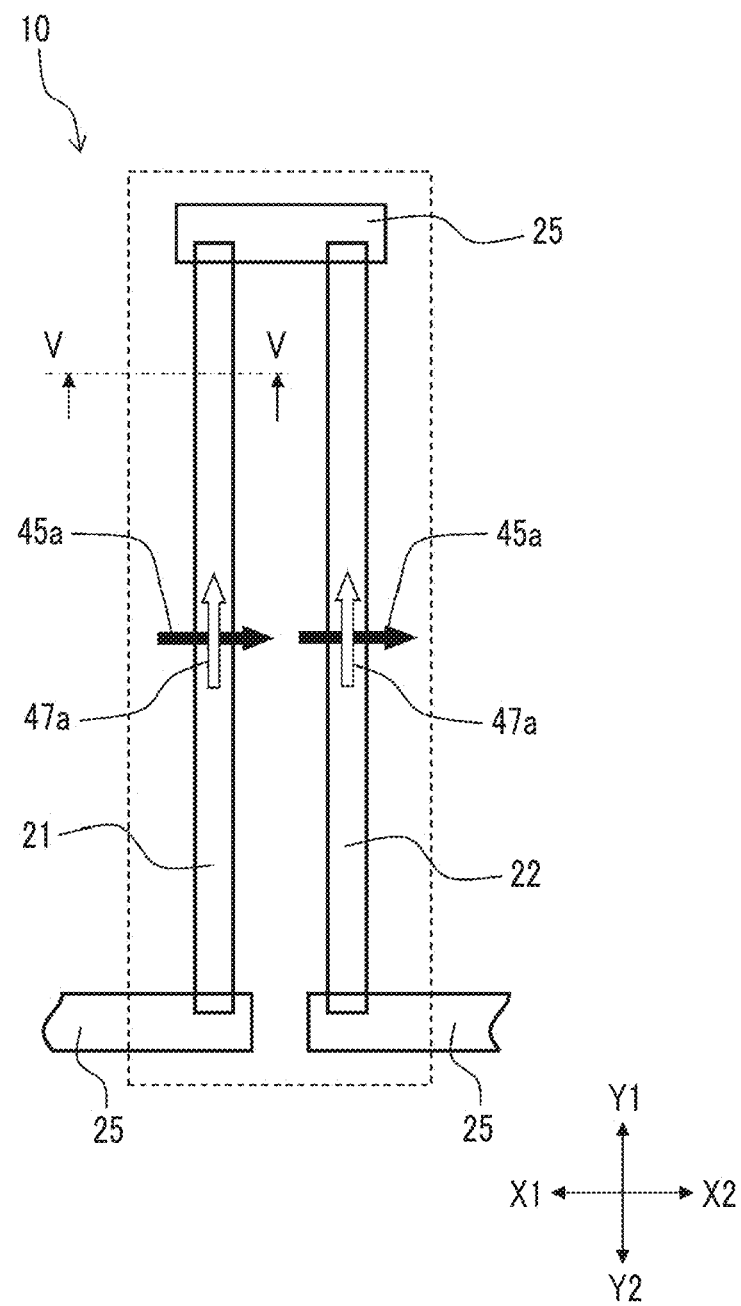
FIG. 11 is a plan view of a magneto resistive effect element constituting the magnetic sensor.
Figure 12:
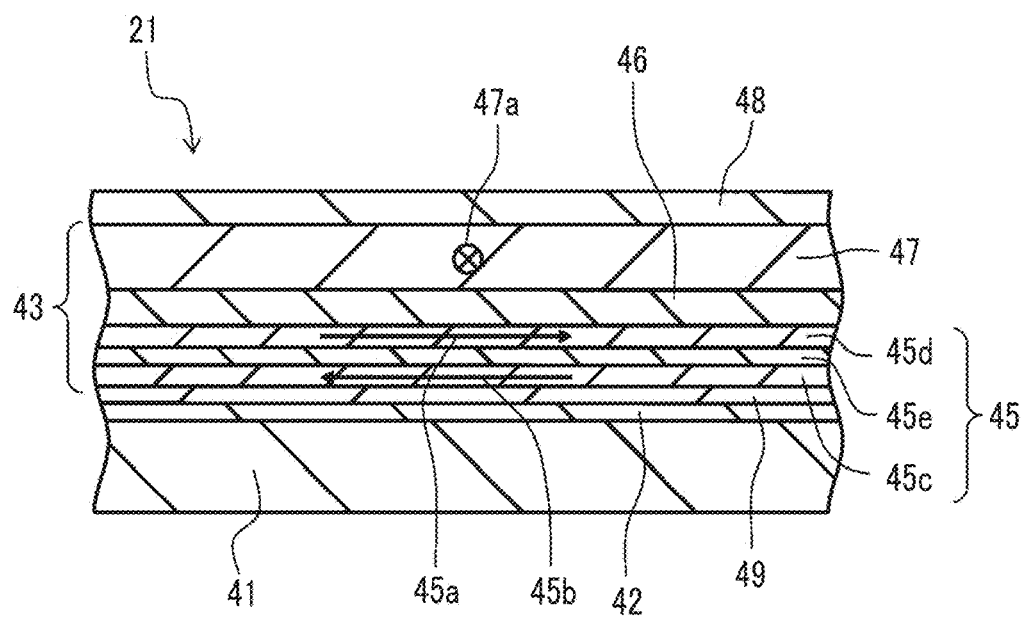
FIG. 12 is a partially enlarged cross-sectional view of the magneto resistive effect element taken along line V-V of FIG. 11 and viewed from an arrow direction.
Figure 12:
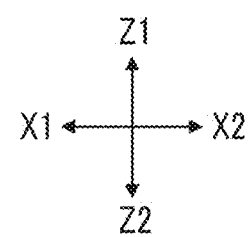

FIG. 11 is a sectional view of a magnetic sensor according to another modification example of the first embodiment. FIG. 12 is a partially enlarged cross-sectional view of the magneto resistive effect element taken along line V-V in FIG. 11 and viewed from an arrow direction.

In this embodiment, a Giant Magneto Resistance (GMR) element is used as the first magneto resistive effect element 21 and the second magneto resistive effect element 22. As illustrated in FIG. 12, the first magneto resistive effect element 21 is configured to have a magneto resistive effect film 43 which can detect an external magnetic field that is applied to within a film surface. The magneto resistive effect film 43 is formed on a surface of a silicon substrate 41 via an insulating film 42 and a seed layer 49. The magneto resistive effect film 43 includes a fixed magnetic layer 45 of which a magnetization direction is fixed, and a free magnetic layer 47 of which a magnetization direction is changed by an external magnetic field. As illustrated in FIG. 12, the fixed magnetic layer 45, a nonmagnetic layer 46, and the free magnetic layer 47 are stacked in this order, and a surface of the free magnetic layer 47 is covered with a protective film 48. Although the first magneto resistive effect element 21 is illustrated in FIG. 12, the other magneto resistive effect element (for example, the second magneto resistive effect element 22) has the same configuration.

In this embodiment, the fixed magnetic layer 45 has a so-called self-pin type of laminated configuration including a first fixing a magnetic layer 45c/a nonmagnetic coupling layer 45e/a second fixed magnetic layer 45d. The first fixed magnetic layer 45c is in contact with the seed layer 49, and the second fixed magnetic layer 45d is in contact with the nonmagnetic layer 46. Magnetization of the first fixed magnetic layer 45c and the magnetization of the second fixed magnetic layer 45d are set in 180° different directions (indicated by reference signs 45a and 45b in FIG. 12) by indirect exchange interaction due to conductive electrons (RKKY interaction). Since a relative relationship between the magnetization direction of the free magnetic layer 47 and the magnetization direction of the second fixed magnetic layer 45d with the nonmagnetic layer 46 sandwiched therebetween contributes to a magneto resistive effect, the magnetization direction of the second fixed magnetic layer 45d becomes the magnetization direction 45a of the fixed magnetic layer illustrated in FIG. 11.

In this embodiment, the insulating film 42 may be a silicon oxide film obtained by thermally oxidizing the silicon substrate 41 or may be, for example, an alumina film or an oxide film formed by sputtering or the like. The first fixed magnetic layer 45c and the second fixed magnetic layer 45d of the fixed magnetic layer 45 are formed of, for example, a soft magnetic material such as a cobalt-iron alloy (CoFe alloy). For the nonmagnetic coupling layer 45e, conductive Ru or the like is used. The nonmagnetic layer 46 is copper (Cu) or the like. For the free magnetic layer 47, a soft magnetic material such as a nickel-iron alloy (NiFe alloy) having a small coercive force and high magnetic permeability may be used. Further, although the free magnetic layer 47 is shown as a single layer in this embodiment, the free magnetic layer 47 can have a configuration in which a NiFe layer and a CoFe layer are laminated. The protective film 48 is tantalum (Ta), or the like.

As illustrated in FIG. 11, the first magneto resistive effect element 21 and the second magneto resistive effect element 22 are formed in an elongated rectangular planar shape extending in the direction Y1-Y2, respectively, and are arranged at an interval from each other in the direction X1-X2. FIG. 11 schematically illustrates the magnetization direction 45a of the fixed magnetic layer and the magnetization direction 47a of the free magnetic layer using respective arrows. The magnetization direction 45a of the fixed magnetic layer of the first magneto resistive effect element 21 and the magnetization direction 45a of the fixed magnetic layer of the second magneto resistive effect element 22 are aligned. In FIG. 11, as a specific example, the magnetization directions are aligned in a direction of the X2 side in the X1-X2 direction among the directions perpendicular to the extension direction (the normal direction of the first surface 15A). Further, the magnetization direction 47a of the free magnetic layer is directed in the same direction (for example, the Y1 side) in the extension direction (Y1-Y2 direction) by shape anisotropy of the first magneto resistive effect element 21 and the second magneto resistive effect element 22. Further, the magnetization direction 45a of the fixed magnetic layer and the magnetization direction 47a of the free magnetic layer are directed in the in-plane of the first magneto resistive effect element 21 and the second magneto resistive effect element 22, and are set to be orthogonal to each other in a state in which the external magnetic field is not applied.

In a case where an external magnetic field is applied in a direction along the magnetization direction (the X2 side in X1-X2 direction) 45a of the fixed magnetic layer, the magnetization direction 47a of the free magnetic layer fluctuates to be aligned with the direction (the X2 side in the X1-X2 direction) of the external magnetic field, and approaches in parallel to the magnetization direction 45a of the fixed magnetic layer, and the electric resistance value decreases.

On the other hand, in a case where an external magnetic field is applied in a direction (the X1 side in the X1-X2 direction) opposite to the magnetization direction (the X2 side in the X1-X2 direction) 45a of the fixed magnetic layer, the magnetization direction 47a of the free magnetic layer fluctuates to be aligned with the direction (the X1 side in the X1-X2 direction) of the external magnetic field, and approaches in anti-parallel to the magnetization direction 45a of the fixed magnetic layer, and the electric resistance value increases.

As illustrated in FIG. 11, the first magneto resistive effect element 21 and the second magneto resistive effect element 22 are connected on the Y1 side in the Y1-Y2 direction, for example, by a wiring portion 25 formed using a nonmagnetic material such as Cu. Further, the Y2 sides in the Y1-Y2 direction of the first magneto resistive effect element 21 and the second magneto resistive effect element 22 are connected to an external circuit or the like through the wiring portions 25.

Figure 13:
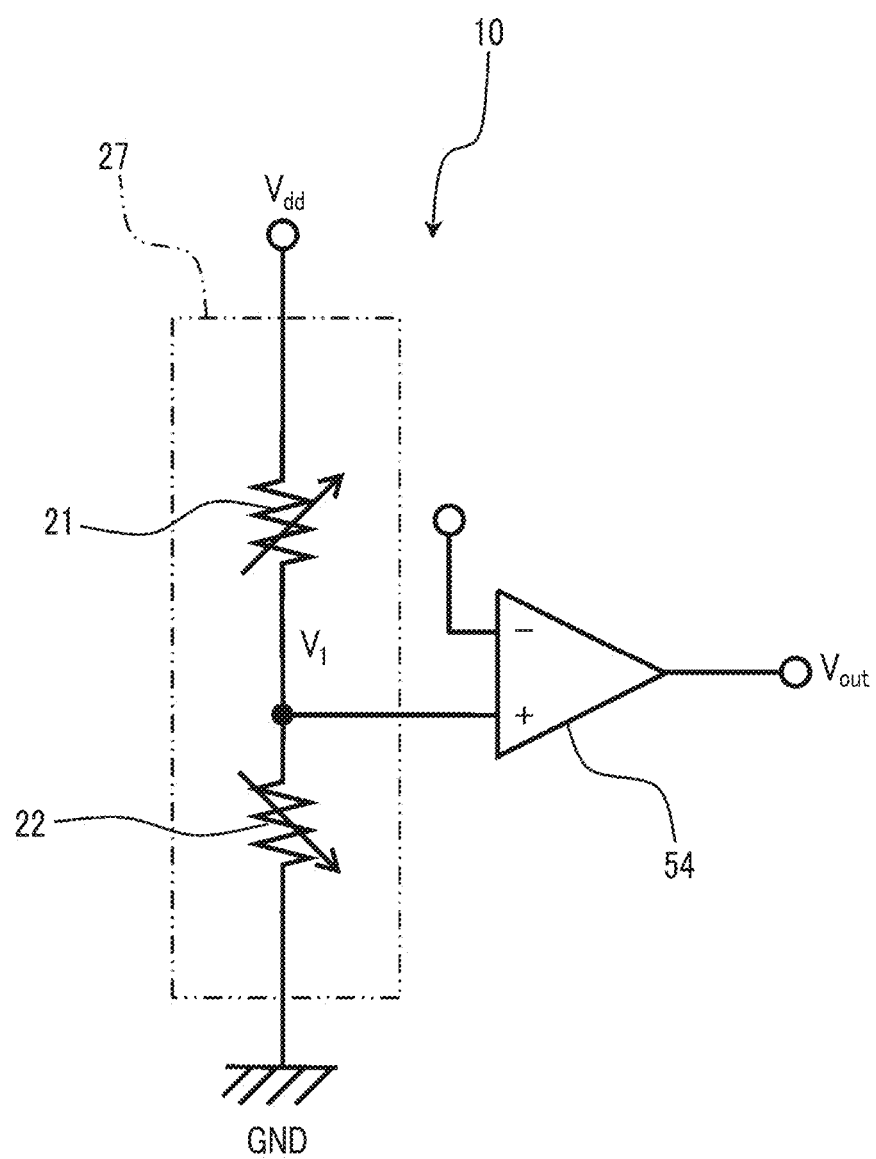
FIG. 13 is a circuit diagram of a half bridge circuit including two magneto resistive effect elements.

FIG. 13 illustrates a circuit diagram of a half bridge circuit including two magneto resistive effect elements. As illustrated in FIG. 13, a first magneto resistive effect element 21 and a second magneto resistive effect element 22 are connected in series between an input terminal (Vdd) and a ground terminal (GND) to constitute a half bridge circuit 27. A midpoint potential (V1) between the first magneto resistive effect element 21 and the second magneto resistive effect element 22 is amplified by a differential amplifier 54 and output to an external circuit (not illustrated) as an output signal of the magnetic sensor 10.

As described above, in the magnetic sensor 10 according to this embodiment, the magnetic field component 51 in the vertical direction (the normal direction of the first surface 15A; the Z1-Z2 direction) magnetically collected in the magnetic field direction conversion portion 30 passes through the first soft magnetic body 35 and the second soft magnetic body 36, flows from the bottom soft magnetic body 40, and is converted into a magnetic field component in an in-plane direction (the horizontal direction) of the first surface 15A of the substrate 15. As illustrated in FIG. 2, the converted magnetic field is applied in a direction of the X1 side of the X1-X2 direction to the first magneto resistive effect element 21, applied in a direction of the X2 side of the X1-X2 direction to the second magneto resistive effect element 22, and act in opposite directions.

Therefore, the magnetization direction 47a of the free magnetic layer of the first magneto resistive effect element 21 illustrated in FIG. 11 is directed in a direction in which an electric resistance value increases, and the magnetization direction 47a of the free magnetic layer of the second magneto resistive effect element 22 is directed in a direction in which an electric resistance value decreases. Accordingly, the midpoint potential (V1) of the half bridge circuit 27 illustrated in FIG. 13 is changed. Accordingly, the magnetic field component 51 in the vertical direction (the normal direction of the first surface 15A; the Z1-Z2 direction) can be detected.

The magnetic sensor 10 according to this embodiment includes the two magneto resistive effect elements (the first magneto resistive effect element 21 and the second magneto resistive effect element 22), but the number of magneto resistive effect elements included in the magnetic sensor according to an embodiment of the present invention is not limited. The number of magneto resistive effect elements included in the magnetic sensor according to an embodiment of the present invention may be 1. A specific example of a structure in this case may include a structure in a case where the magnetic sensor 10 does not include the second magneto resistive effect element 22.

A specific example of a case where the number of magneto resistive effect elements included in the magnetic sensor according to an embodiment of the present invention is 3 or more may include a case where the magnetic sensor includes two half bridge circuits 27, and the two half bridge circuits 27 constitute a full bridge circuit. Hereinafter, such a magnetic sensor will be described as a magnetic sensor according to the second embodiment of the present invention.

Figure 14:
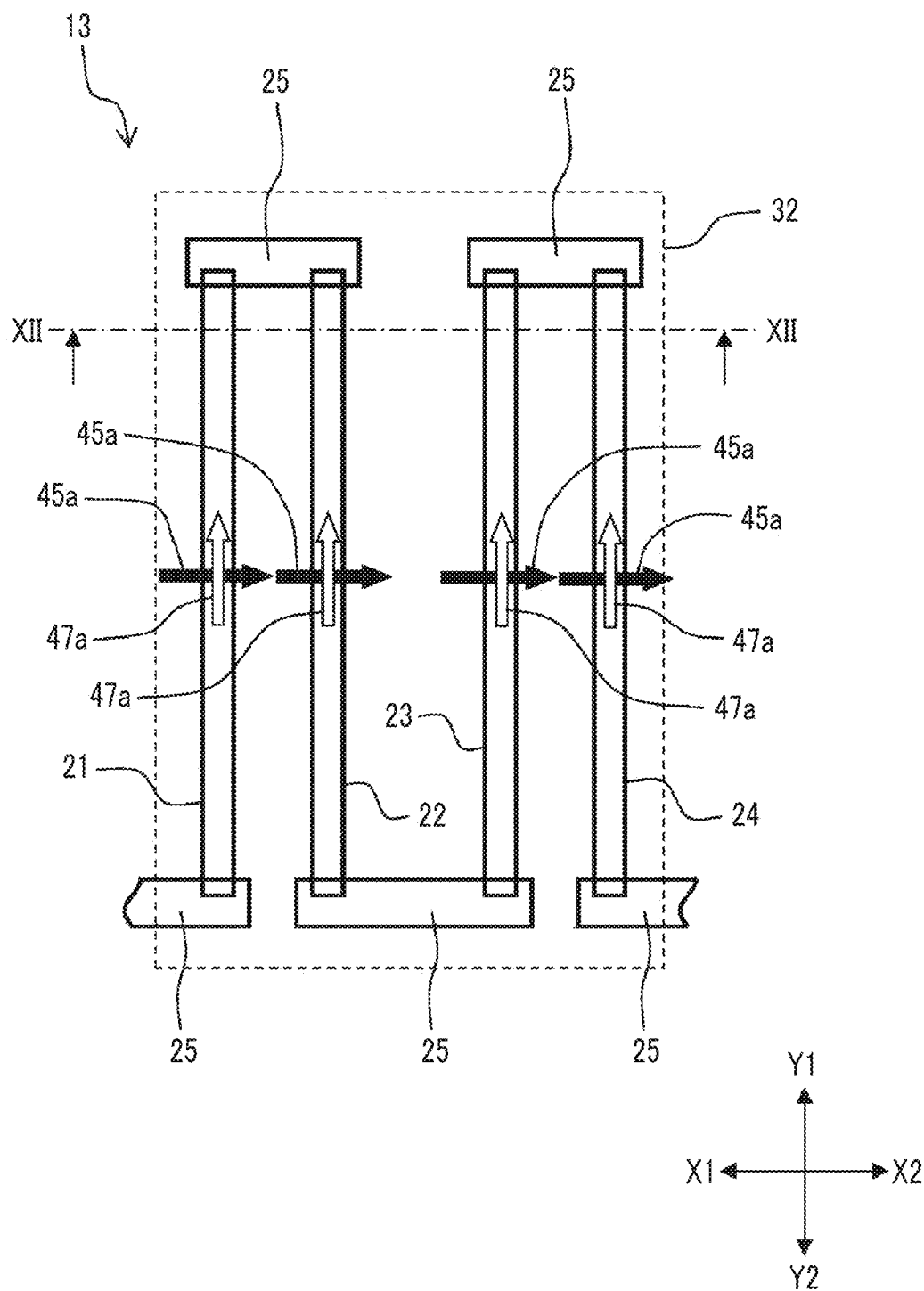
FIG. 14 is a plan view of a magneto resistive effect element illustrating a magnetic sensor of a second embodiment.
Figure 15:
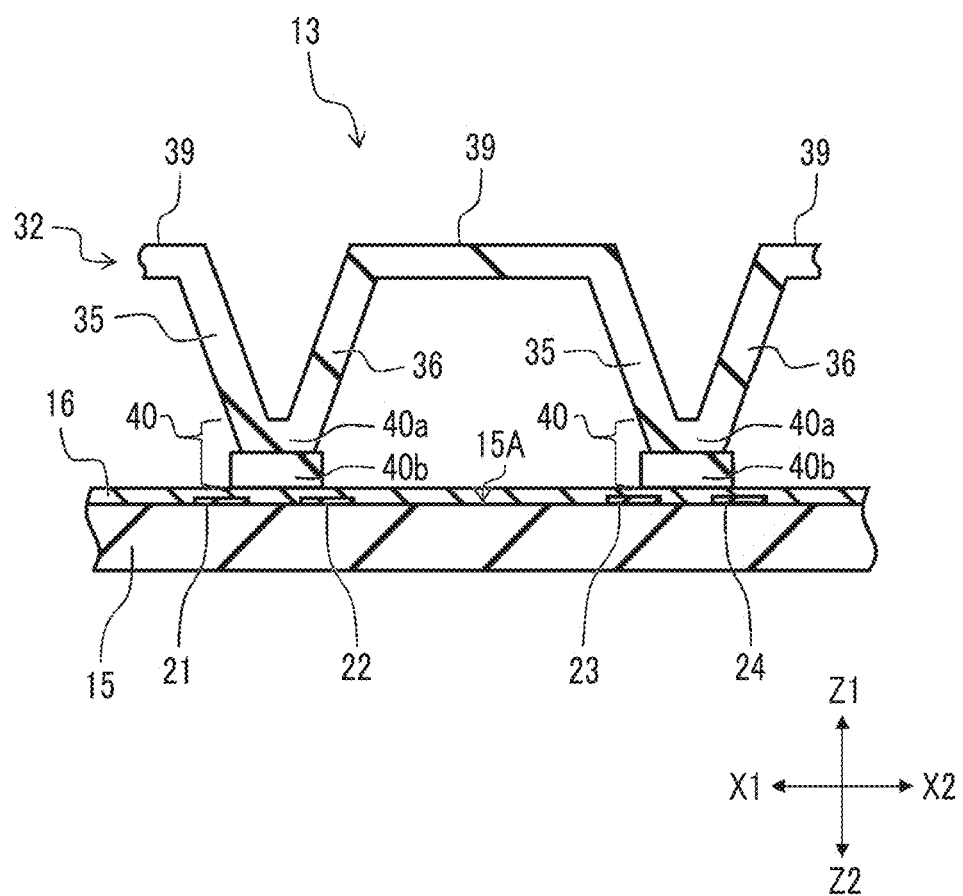
FIG. 15 is a cross-sectional view of the magnetic sensor taken along line XII-XII of FIG. 14 and viewed from an arrow direction.

FIG. 14 illustrates the magnetic sensor of the second embodiment and is a plan view of the magneto resistive effect elements constituting the magnetic sensor. FIG. 15 is a cross-sectional view of the magnetic sensor taken along line XII-XII in FIG. 14 and viewed from an arrow direction. Further, FIG. 16 is a circuit diagram of a full bridge circuit including four magneto resistive effect elements.

The magnetic sensor 13 of this embodiment is different in that a plurality of pairs (specifically, two pairs) of soft magnetic bodies (the first soft magnetic body 35 and the second soft magnetic body 36) are provided. As illustrated in FIG. 15, the first soft magnetic body 35 and the second soft magnetic body 36 are alternately formed to be continuous in the X1-X2 direction. The first soft magnetic body 35 and the second soft magnetic body 36 that are adjacent are connected by a bottom soft magnetic body 40 on the side proximal to the first surface 15A, and are connected by an extension portion 39 on the side distal from the first surface. The bottom soft magnetic body 40 and the extension portion 39 are provided alternately in the X1-X2 direction. The plurality of first soft magnetic bodies 35 and the plurality of second soft magnetic bodies 36 are formed to be connected in the X1-X2 direction to constitute one magnetic field direction conversion portion 32.

As illustrated in FIG. 15, the respective magneto resistive effect elements (the first magneto resistive effect elements 21 and 23 and the second magneto resistive effect elements 22 and 24) are arranged on the side of the plurality of first soft magnetic bodies 35 and the plurality of second soft magnetic bodies 36 proximal to the first surface 15A. As illustrated in FIG. 14, the magnetization directions 45a of the fixed magnetic layers of the four magneto resistive effect elements (the first magneto resistive effect elements 21 and 23 and the second magneto resistive effect elements 22 and 24) are directed in the same direction (to the X2 side in the X1-X2 direction). Further, in a state where no external magnetic field is applied, the magnetization directions 47a of the free magnetic layers are directed to the Y1 side in the extension direction (the Y1-Y2 direction) of the magneto resistive effect elements (the first magneto resistive effect elements 21 and 23 and the second magneto resistive effect elements 22 and 24) by shape anisotropy.

Figure 16:
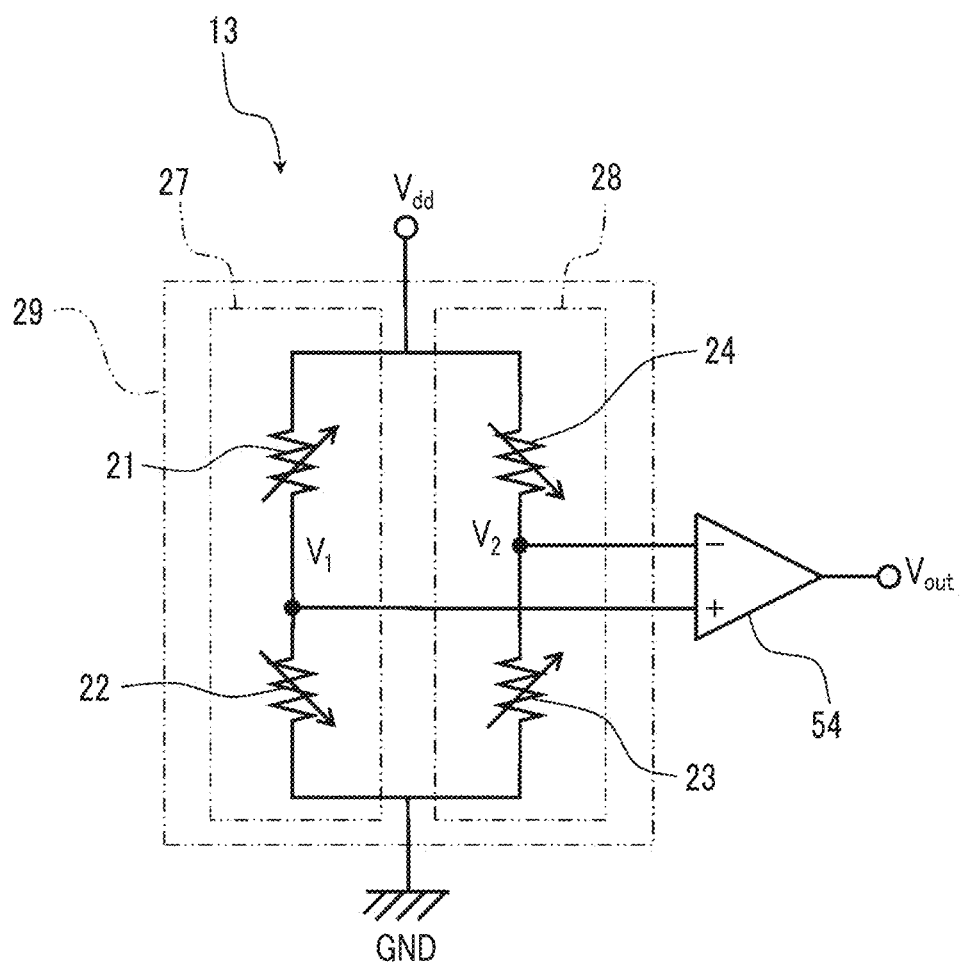
FIG. 16 is a circuit diagram of a full bridge circuit according to this embodiment.

In this embodiment, as illustrated in FIG. 16, a full bridge circuit 29 includes four magneto resistive effect elements (first magneto resistive effect elements 21 and 23 and second magneto resistive effect elements 22 and 24). A midpoint potential (V1) is output from a half bridge circuit 27 in which the first magneto resistive effect element 21 and the second magneto resistive effect element 22 are connected in series, and a midpoint potential (V2) is output from a half bridge circuit 28 in which the first magneto resistive effect element 23 and the second magneto resistive effect element 24 are connected in series. The half bridge circuit 27 and the half bridge circuit 28 are connected in parallel between an input terminal (Vdd) and a ground terminal (GND) to constitute the full bridge circuit 29. As illustrated in FIG. 16, a difference between the midpoint potential (V1) and the midpoint potential (V2) is amplified by a differential amplifier 54 and output as a sensor output (Vout).

In this embodiment, the full bridge circuit 29 includes the four magneto resistive effect elements (the first magneto resistive effect elements 21 and 23 and the second magneto resistive effect elements 22 and 24), but the present invention is not limited thereto. A large number of magneto resistive effect elements can be used in order to increase an output.

Thus, by constituting the full bridge circuit 29, since resistance changes caused by the magnetic field component in the horizontal direction (the in-plane direction of the first surface 15A) are the same in the four magneto resistive effect elements (the first magneto resistive effect elements 21 and 23 and the second magneto resistive effect elements 22 and 24), the resistance change is not output as the sensor output from the full bridge circuit 29, and only a resistance change due to a magnetic field component in the vertical direction is output (the normal direction of the first surface 15A; the Z1-Z2 direction).

Further, even in a case where a plurality of first soft magnetic bodies 35 and a plurality of second soft magnetic bodies 36 are provided continuously as illustrated in FIG. 9, it is possible to suppress occurrence of residual magnetization in the Z1-Z2 direction and to suppress a degradation of the sensor sensitivity due to an offset of the sensor output, or the like.

Further, in this embodiment, since the plurality of first soft magnetic bodies 35 and the plurality of second soft magnetic bodies 36 are continuously provided, the magnetic field component in the horizontal direction (a magnetic field component in the X1-X2 direction and a magnetic field component in the Y1-Y2 direction) is effectively collected in the first soft magnetic body 35 and the second soft magnetic body 36 that are continuous. Therefore, since it is possible to reliably detect the magnetic field component 51 in the vertical direction (the normal direction of the first surface 15A; the Z1-Z2 direction) by suppressing application of the magnetic field component in the horizontal direction (the magnetic field component in the X1-X2 direction and the magnetic field component in the Y1-Y2 direction) to the respective magneto resistive effect elements 21 to 24, it is possible to improve the sensor sensitivity.

A method of fabricating the magnetic sensor according to some embodiments of the present invention is not limited. As described above, in the magnetic field direction conversion portion 30, since the first soft magnetic body 35 and the second soft magnetic body 36 are magnetically connected to the positioning soft magnetic body 40b, the soft magnetic bodies can be fabricated as separate members. By fabricating the soft magnetic bodies in this manner, it is easy to fabricate the magnetic field direction conversion portion 30, and it is possible to accurately define a relative position between the first most proximal portion 40E1 of the positioning soft magnetic body 40b and the first magneto resistive effect element 21 and a relative position between the second most proximal portion 40E2 of the positioning soft magnetic body 40b and the second magneto resistive effect element 22.

Hereinafter, a method of fabricating the magnetic sensor 10B illustrated in FIG. 4 will be described as a method of fabricating a magnetic sensor according to an embodiment of the present invention. FIGS. 17 to 24 are views illustrating a method of fabricating a magnetic sensor according to an embodiment of the present invention.

Figure 17:
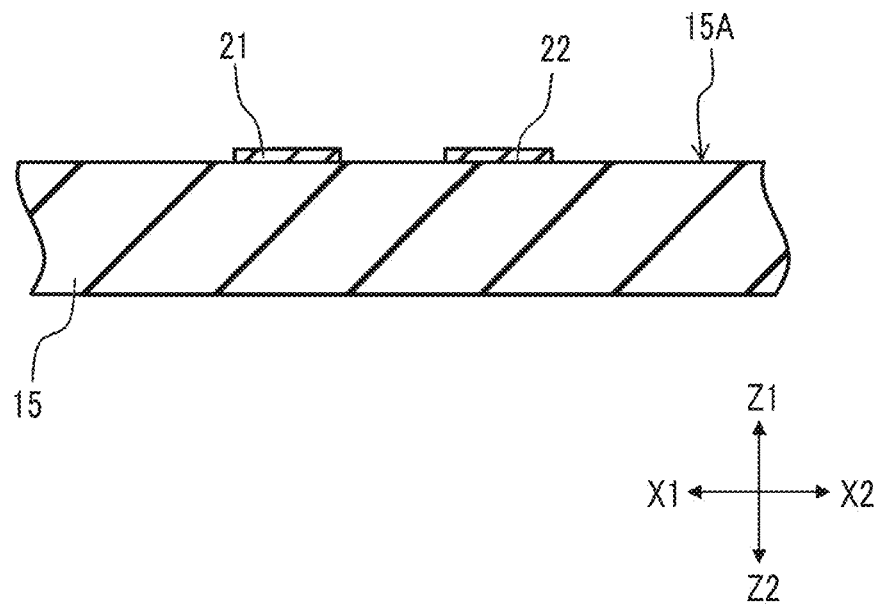
FIG. 17 is a view illustrating a method of fabricating a magnetic sensor according to an embodiment of the present invention.

In the method of fabricating a magnetic sensor according to an embodiment of the present invention, first, the first magneto resistive effect element 21 and the second magneto resistive effect element 22 are formed on the first surface 15A of the substrate 15 formed of silicon or the like (FIG. 17). As described above, since the magneto resistive effect element has the magneto resistive effect film 43, sequentially laminating the respective layers constituting the magneto resistive effect film 43 is performed. Film formation in a magnetic field is performed so that the second fixed magnetic layer 45d of the first magneto resistive effect element 21 is magnetized in the X2-side direction of the X1-X2 direction (the first direction). Since the second magneto resistive effect element 22 is fabricated simultaneously with the first magneto resistive effect element 21, the same magnetization as in the first magneto resistive effect element 21 is performed in the second magneto resistive effect element 22.

Figure 18:
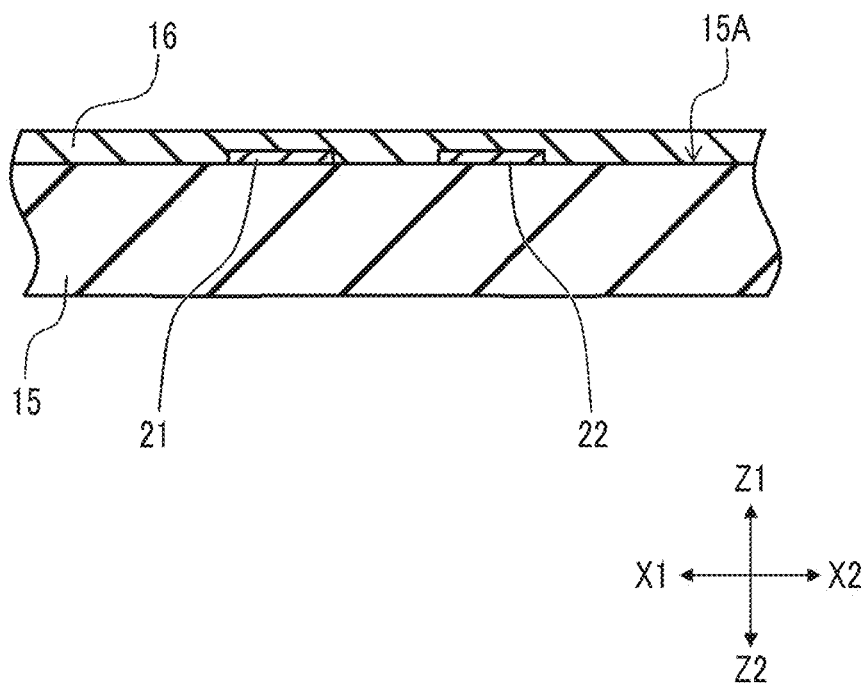
FIG. 18 is a view illustrating a method of fabricating a magnetic sensor according to an embodiment of the present invention.

Next, the insulating nonmagnetic layer 16 is formed so as to cover the magneto resistive effect elements (FIG. 18). An example of a material constituting the insulating nonmagnetic layer 16 includes alumina. A thickness of the insulating nonmagnetic layer 16 is not limited. Since a thickness of the first magneto resistive effect element 21 and the second magneto resistive effect element 22 is usually approximately 0.1 µm and a magnetic field flowing from the magnetic field direction conversion portion 30 travels in a horizontal direction (a in-plane direction of the first surface 15A) inside the insulating nonmagnetic layer 16, it may be preferable for the insulating nonmagnetic layer 16 to have a thickness of approximately 0.2 µm or more. A wiring layer (not illustrated) that is connected to the first magneto resistive effect element 21 and the second magneto resistive effect element 22 may be formed prior to formation of the insulating nonmagnetic layer 16.

Figure 19:
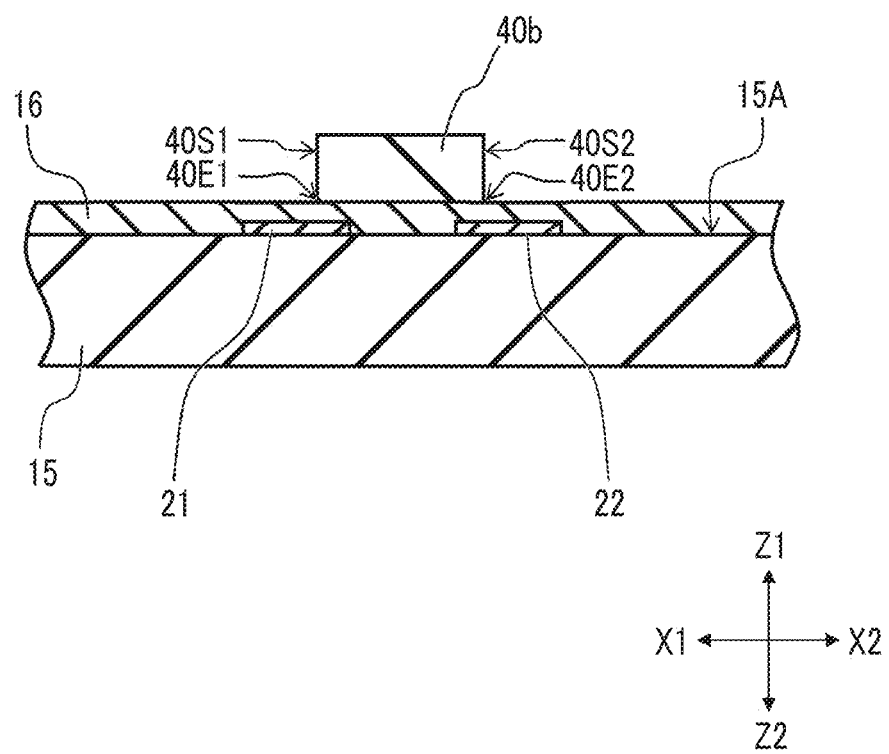
FIG. 19 is a view illustrating a method of fabricating a magnetic sensor according to an embodiment of the present invention.

Then, the positioning soft magnetic body 40b is formed on a surface of the insulating nonmagnetic layer 16 (FIG. 19). The first most proximal portion 40E1 and the second most proximal portion 40E2 are defined by the surfaces 40S1 and 40S2 of the positioning soft magnetic body 40b arranged in the X1-X2 direction (the first direction). Since the positioning soft magnetic body 40b has a flat shape, which is a relatively easily fabricated shape, the positioning soft magnetic body 40b can be fabricated using a known photolithographic fabrication technology, such as a frame electroplating method. If the positioning soft magnetic body 40b has, for example, a thickness of up to approximately 5 µm, arrangement accuracy and shape accuracy of the positioning soft magnetic body 40b can be suppressed to be approximately 50 nm or less. Accordingly, a variation in the relative position between the first most proximal portion 40E1 and the first magneto resistive effect element 21 and a variation in the relative position between the second most proximal portion 40E2 and the second magneto resistive effect element 22 can be suppressed to be approximately 50 nm or less.

Figure 20:
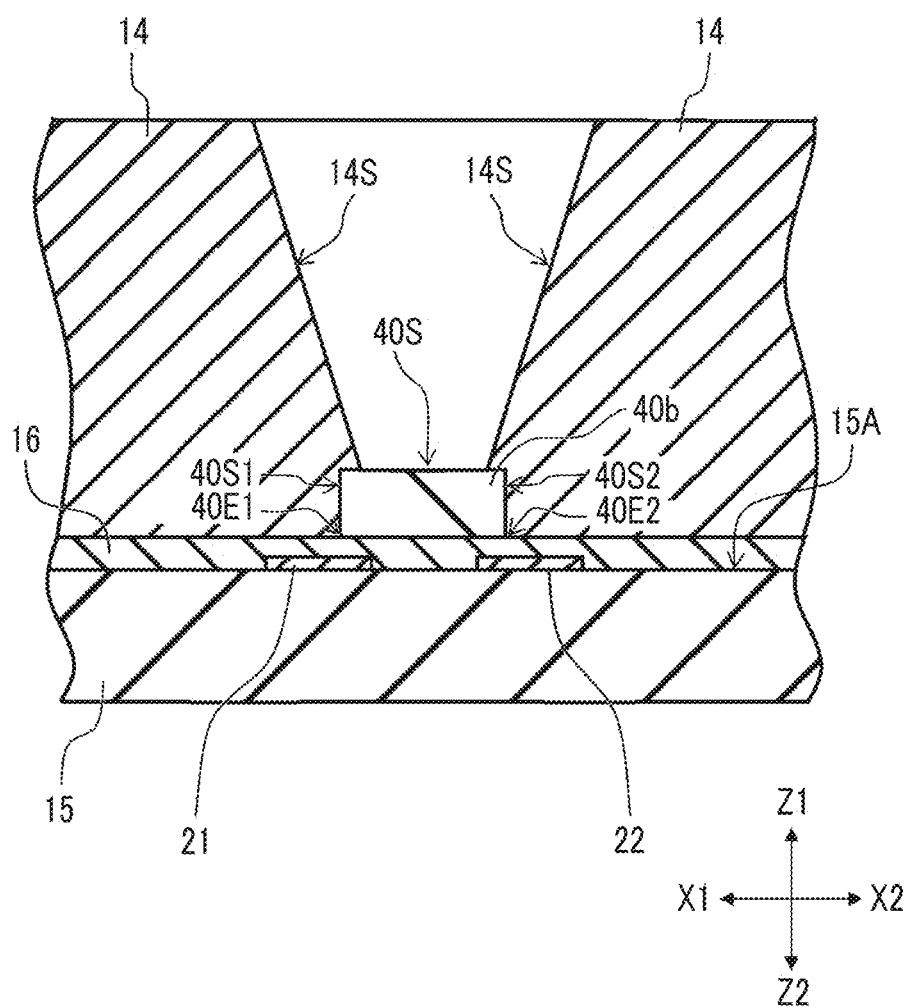
FIG. 20 is a view illustrating a method of fabricating a magnetic sensor according to an embodiment of the present invention.

After the positioning soft magnetic body 40b is formed on the surface of the insulating nonmagnetic layer 16, the insulating nonmagnetic body 14 is formed in a portion that is on the surface of the insulating nonmagnetic layer 16 and in which the positioning soft magnetic body 40b is not arranged, in other words, on the surface of the insulating nonmagnetic layer 16 and around the positioning soft magnetic body 40b (FIG. 20). A type of material constituting the nonmagnetic body 14 is not limited. An example of such a material may include silicon nitride which is formed using CVD.

A thickness of the nonmagnetic body 14 is not limited. As described above, the magnetic sensor 10B has a structure in which it is possible to improve measurement accuracy of the magnetic field that is measured in the first magneto resistive effect element 21 and the second magneto resistive effect element 22 by forming the positioning soft magnetic body 40b with high shape accuracy and appropriately setting the relative position between the first most proximal portion 40E1 and the first magneto resistive effect element 21 and the relative position between the second most proximal portion 40E2 and the second magneto resistive effect element 22. Therefore, even when the thickness of the nonmagnetic body 14 is, for example, 5 µm or more, a degree of a change in sensor sensitivity of the magnetic sensor 10B due to such a thickness is mitigated. However, since a low profile of the magnetic sensor 10B is included in aims of the magnetic sensor according to the embodiment of the present invention as shown in International Publication No. WO2011/068146, an upper limit of the thickness of the nonmagnetic body 14 is preferably 10 µm in some cases.

In this case, it is possible to more stably improve arrangement accuracy of the first most proximal portion 40E1 and the second most proximal portion 40E2 by forming the nonmagnetic body 14 to cover the first most proximal portion 40E1 and the second most proximal portion 40E2 of the positioning soft magnetic body 40b, as illustrated in FIG. 20. Further, the nonmagnetic body 14 is formed so that at least a portion of the second surface 40S that is a surface opposite to the side facing the first surface 15A of the positioning soft magnetic body 40 is exposed, as illustrated in FIG. 20. By forming the nonmagnetic body 14, it is easy to magnetically connect a pair of soft magnetic bodies (the first soft magnetic body 35 and the second soft magnetic body 36) formed through a subsequent process to the positioning soft magnetic body 40.

The nonmagnetic body 14 illustrated in FIG. 20 is formed so that a recessed portion having a portion exposed in the second surface 40S as a bottom surface and the surfaces 14S formed of the nonmagnetic body 14 as side surfaces is defined, and the side surfaces of the recessed portion include a taper shape spreading in a direction away from the bottom surface. By having such a shape, it is easy for a shape of a section in which the X1-X2 direction and the Z1-Z2 direction are in-plane directions in the pair of soft magnetic bodies (the first soft magnetic body 35 and the second soft magnetic body 36) formed on the surfaces 14S formed of the nonmagnetic body 14 to be a V shape.

Figure 21:
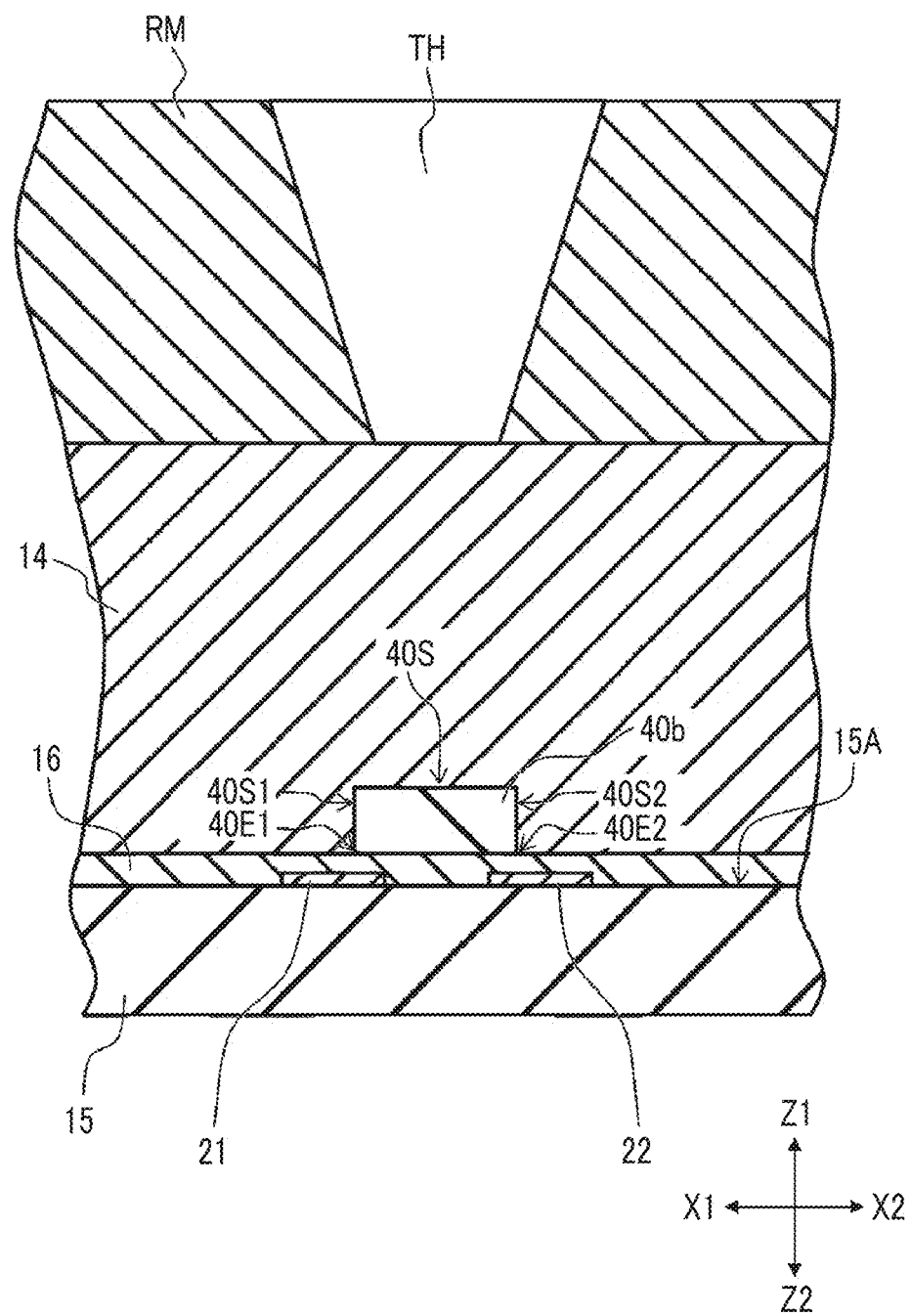
FIG. 21 is a view illustrating a method of fabricating a magnetic sensor according to an embodiment of the present invention.

A method of forming the surfaces 14S of the nonmagnetic body 14 in the shape as illustrated in FIG. 20 is not limited. An example thereof may include s method to be described next. For example, as illustrated in FIG. 21, the nonmagnetic body 14 is formed to cover the second entire surface 40S of the positioning soft magnetic body 40*b*, and a resist layer RM is formed on the nonmagnetic body 14. Then, a tapered hole TH with a taper having a diameter decreasing as the hole approaches the first surface 15A is formed to penetrate the resist layer RM. Etching of the nonmagnetic body 14 is performed using the resist layer RM with the tapered hole TH as a mask so that a shape of the tapered hole TH is transferred to the nonmagnetic body 14 (a portion in which the resist layer RM is relatively thick is shallow, and a portion in which the resist layer RM is relatively thin is deep). A method of forming the tapered hole TH is not limited. The tapered hole TH may be directly formed in the resist layer RM through the control of an exposure process or the control of a development process. Alternatively, a through hole VH that does not substantially have a taper as illustrated in FIG. 22 may be formed, and then, an inner wall shape of the through hole VH may be changed, for example, by heating the resist layer RM to obtain the tapered hole TH.

Figure 22:
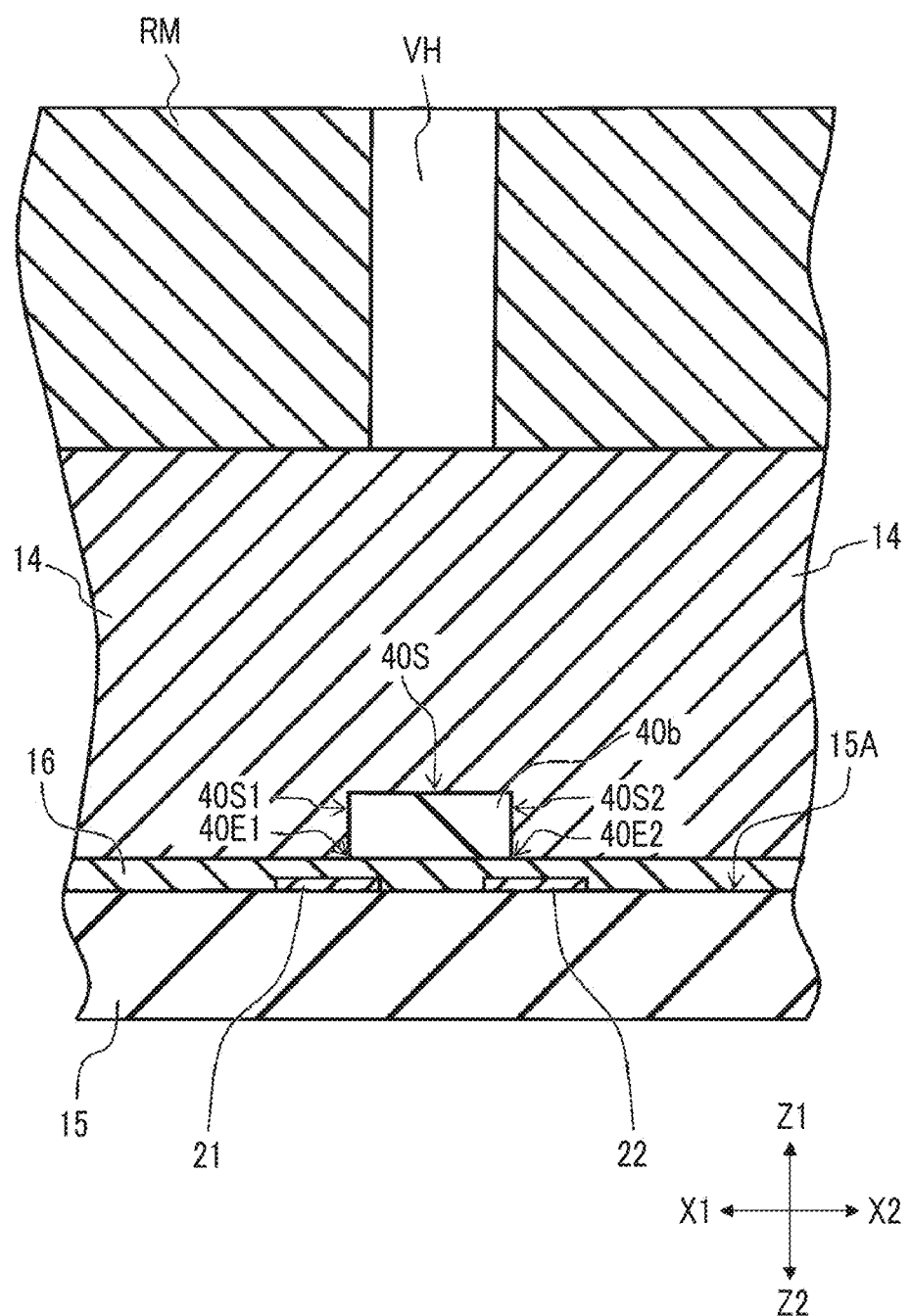
FIG. 22 is a view illustrating a method of fabricating a magnetic sensor according to an embodiment of the present invention.

An example of another method of forming the surfaces 14S of the nonmagnetic body 14 in the shape as illustrated in FIG. 20 may include forming a through hole VH that does not substantially have a taper as illustrated in FIG. 22, and performing etching with low anisotropy such as reactive ion etching (RIE) using a resist layer RM having this through hole VH as a mask. In the etching with low anisotropy, it is possible to increase an etching rate, but it is not easy to increase accuracy of a processing shape. Since the pair of soft magnetic bodies (the first soft magnetic body 35 and the second soft magnetic body 36) are formed on the surface 14S of the nonmagnetic body 14 caused by the etching, process accuracy of etching for forming the surface 14S of the nonmagnetic body 14 influences accuracy of a relative position between the pair of soft magnetic bodies (the first soft magnetic body 35 and the second soft magnetic body 36) and the magneto resistive effect element (the first magneto resistive effect element 21 and the second magneto resistive effect element 22). However, as described above, in the magnetic sensor 10B according to this embodiment, an influence of the relative position between the pair of the soft magnetic bodies (the first soft magnetic body 35 and the second soft magnetic body 36) and the first magneto resistive effect element 21 and the relative position between the pair of the soft magnetic bodies and the second magneto resistive effect element 22, on detection performance of the magnetic field in the first direction of the first magneto resistive effect element 21 and the second magneto resistive effect element 22 is relatively less. Therefore, in the method of fabricating the magnetic sensor 10B according to this embodiment, etching with high processing speed and low anisotropy can be utilized as a preferred example of etching for forming the surfaces 14S of the nonmagnetic body 14.

Figure 23:
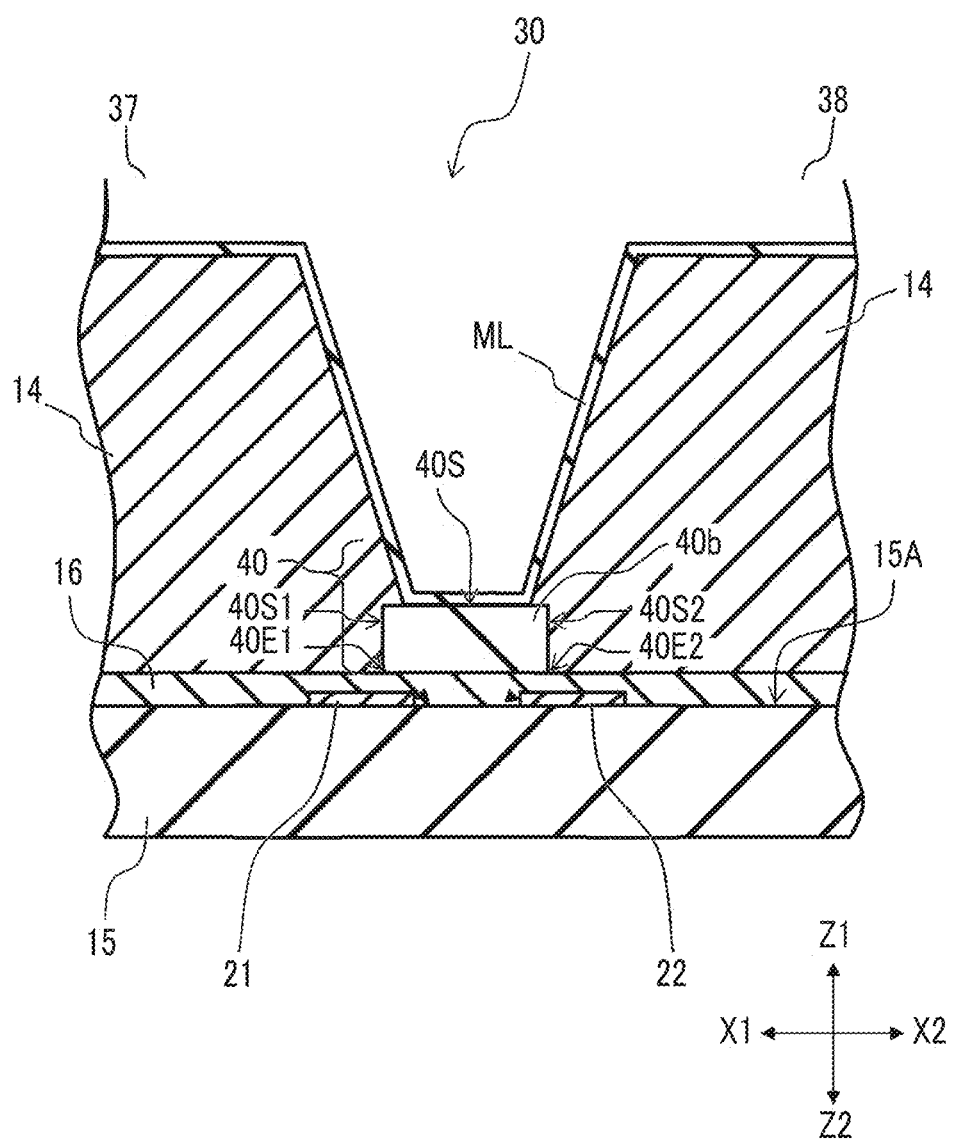
FIG. 23 is a view illustrating a method of fabricating a magnetic sensor according to an embodiment of the present invention.

Subsequently, a conductorization process is performed on the exposed surfaces (including the surfaces 14S) of the nonmagnetic body 14. A type of conductorization process is arbitrary. The conductorization may be performed using a dry deposition technology such as sputtering or the conductorization may be performed using a wet deposition technology such as electroless plating. A thickness of a conductor layer ML formed through the conductorization process is arbitrary so long as the thickness enables a subsequent plating process. As illustrated in FIG. 23, the conductor layer ML formed by the conductorization process may be also formed on the second surface 40S.

Figure 24:
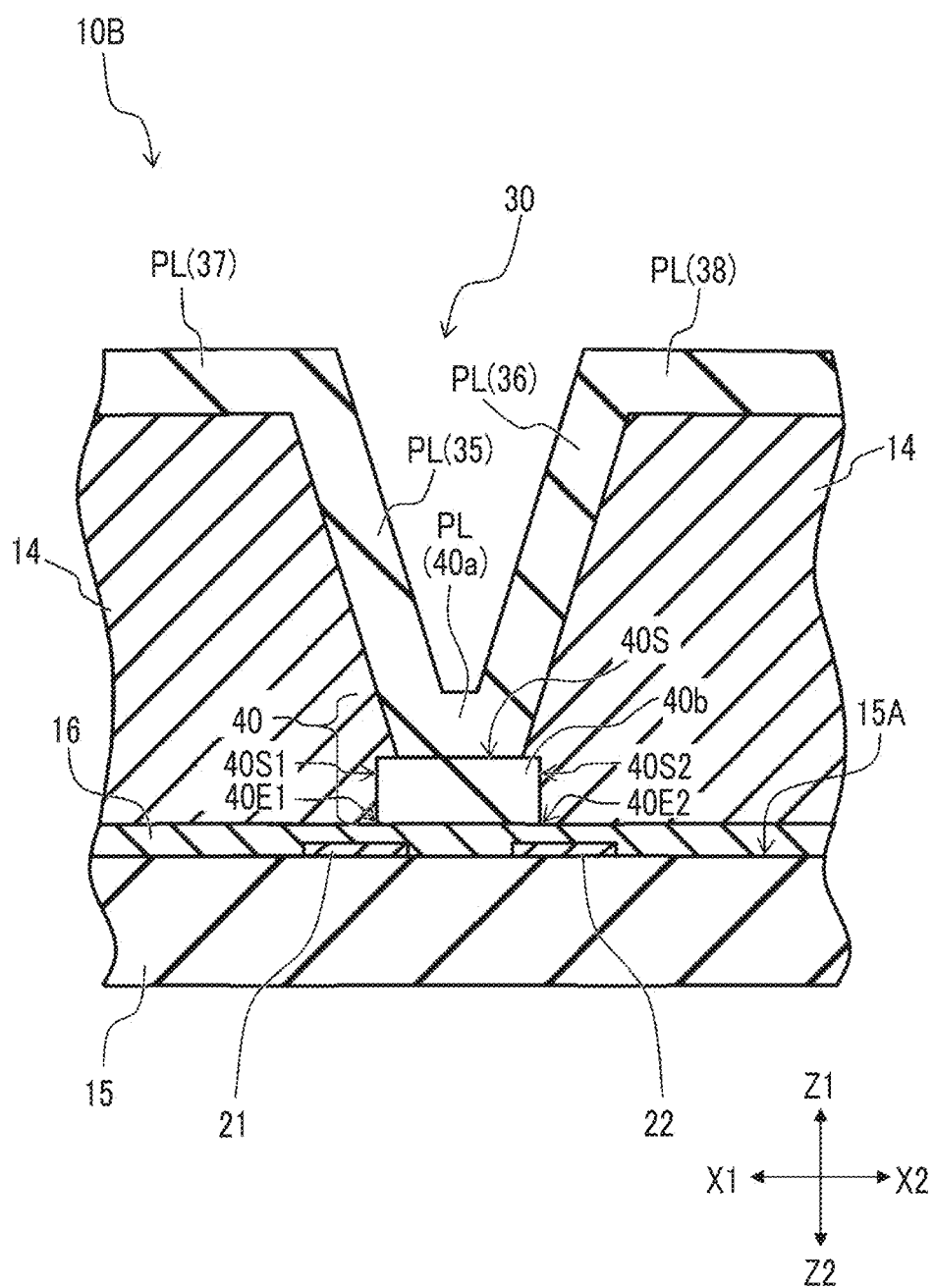
FIG. 24 is a view illustrating a method of fabricating a magnetic sensor according to an embodiment of the present invention.

After the conductorization process is performed in this manner, a plating process is performed on the second surface 40S (there may be the conductor layer ML formed through the conductorization process) and on the conductorized surface of the nonmagnetic body 14 (a surface of the conductor layer ML formed through the conductorization process) to form a plating layer PL. Through this plating process, a pair of soft magnetic bodies (the first soft magnetic body 35 and the second soft magnetic body 36) including the plating layer PL are obtained (FIG. 24). In a case where a thickness of the conductor layer ML is small, the conductor layer ML and the plating layer PL may be substantially indistinguishable. In FIG. 24, a display of the conductor layer ML is omitted in such a case. Further, through this plating process, the first soft magnetic body 35 and the second soft magnetic body 36, and the positioning soft magnetic body 40*b* are magnetically connected. In FIG. 24, the plating layer PL is also formed on the second surface 40S to constitute the connection portion 40*a*, and the plating layer PL formed on a surface on the Z2 side in the Z1-Z2 direction among the surfaces of the nonmagnetic body 14 constitutes the first extension portion 37 and the second extension portion 38. On the plating layer PL, a protective layer formed of a material such as silicon nitride may be formed.

Using the above fabricating method, the magnetic sensor 10B is fabricated.

The present invention has been described with the embodiments, but the technical scope of the present invention is not limited to the scope described in the above embodiments. It is apparent to those skilled in the art that various modifications or improvements can be added to the above embodiments. It is apparent from the description of the claims that the embodiments to which the modifications or improvements have been added can be included in the technical scope of the present invention. For example, other layers may be provided between the respective components shown as being stacked in the drawings or the like as long as the effects of the present invention can be appropriately obtained.

What is claimed is:

1. A magnetic sensor, comprising:
   a substrate having a first surface;
   a first magneto resistive effect element and a second magneto resistive element disposed on the first surface of the substrate, each of the first and second magneto resistive effect elements having a sensitivity axis in a first direction and extending in a second direction perpendicular to the first direction;
   a positioning soft magnetic body extending in the second direction and provided for the first and second magneto resistive effect elements without being in contact therewith, the positioning soft magnetic body having:

a first most proximal portion defined with respect to the first magneto resistive effect element, and a second most proximal portion defined with respect to the second magneto resistive effect element;

a first side surface extending from the first most proximal portion in a third direction perpendicular to the first surface, and a second side surface opposed to the first surface, the second surface extending from the second most proximal portion in the third direction; and a first width along the first direction defined between the first and second side surfaces; and a pair of first and second soft magnetic bodies extending in the second direction and adjacent to each other in the first direction in a plan view from above the first surface, the first and second magnetic bodies being integrally formed via a connection portion therebetween so as to form an integral soft magnetic body by extending from the connection portion in a respective direction away from the first surface viewed in a cross section perpendicular to the second direction, wherein the integral soft magnetic body is magnetically connected to the positioning soft magnetic body via the connection portion, the positioning soft magnetic body being a separate element independent of the connection portion, the connection portion having a bottom width along the first direction on a side of the positioning soft magnetic body, the first width of the positioning soft magnetic body being greater than the bottom width of the connection portion.

2. The magnetic sensor according to claim 1, wherein, in the plan view from above the first surface, the first and second most proximal portions of the positioning magnetic body fall within the magneto resistive effect element.

3. The magnetic sensor according to claim 1, wherein a thickness of the positioning soft magnetic body in the third direction is 5 µm or less.

4. The magnetic sensor according to claim 1, wherein the first and second soft magnetic bodies are inclined toward opposite sides of a center position therebetween in the first direction.

5. The magnetic sensor according to claim 1, wherein a distance between the first and second soft magnetic bodies increases as a respective distance of the first and second soft magnetic bodies from the first surface increases.

6. The magnetic sensor according to claim 1, further comprising:

an insulating nonmagnetic body provided on the first surface, wherein the pair of soft magnetic bodies are formed on an upper a surface of the insulating nonmagnetic body.

7. The magnetic sensor according to claim 6, wherein the first and second most proximal portions of the positioning soft magnetic body are surrounded by the insulating nonmagnetic body.

8. The magnetic sensor according to claim 1, wherein each of the first and second soft magnetic bodies further includes an extension portion extending in the first direction from a respective side thereof opposite to an inner side thereof which is magnetically connected to the positioning soft magnetic body.

9. The magnetic sensor according to claim 1, wherein:

each of the first and second magneto resistive effect elements includes:

a fixed magnetic layer in which magnetization is fixed in a direction parallel to the first direction, and a free magnetic layer in which a magnetization direction thereof is changed by an external magnetic field applied thereto, and a fixed magnetization direction of the fixed magnetic layer in the first magneto resistive effect element and a fixed magnetization direction of the fixed magnetic layer in the second magneto resistive effect element are aligned with each other.

10. The magnetic sensor according to claim 9, wherein the first and second magneto resistive effect elements are connected in series to constitute a half bridge circuit.

11. A magnetic sensor device formed of two magnetic sensors each according to claim 10, wherein two half bridge circuits of the two magnetic sensors constitute a full bridge circuit.

12. The magnetic sensor device according to claim 11, wherein the two first magneto resistive effect elements and the two second magneto resistive effect elements included in the full bridge circuit are arranged so as to aligned in the first direction.

* * * * *